United States Patent [19]

Rebourg

[11] 4,357,677

[45] Nov. 2, 1982

[54] HADAMARD CONVERTERS EMPLOYING CHARGE TRANSFER DEVICES

[76] Inventor: Jean-Claude Rebourg, 95, Ave. de la Clairere, 78120 Rambouillet, France

[21] Appl. No.: 147,137

[22] Filed: May 6, 1980

[30] Foreign Application Priority Data

May 18, 1979 [FR] France ............................ 79 12747

[51] Int. Cl.[3] ........................ G06G 7/12; H03H 15/02

[52] U.S. Cl. .................................. 364/826; 358/133; 364/862

[58] Field of Search ............... 364/825, 826, 861, 862; 358/13, 133, 138

[56] References Cited

U.S. PATENT DOCUMENTS

| | | | |
|---|---|---|---|
| 3,997,973 | 12/1976 | Buss | 364/825 X |
| 4,092,725 | 5/1978 | Hershman | 364/862 X |
| 4,099,250 | 7/1978 | Finnila et al. | 364/862 X |
| 4,100,513 | 7/1978 | Weckler | 364/862 X |
| 4,107,550 | 8/1978 | Jacquart et al. | 364/862 X |
| 4,149,128 | 4/1979 | White | 364/825 X |
| 4,161,785 | 7/1979 | Gasparek | 364/862 X |
| 4,245,330 | 1/1981 | Rebourg | 364/826 |

*Primary Examiner*—Felix D. Gruber

[57] ABSTRACT

A converter for carrying out Hadamard conversion on periodic sampled signals, such conversion giving from a sequence of N input samples another sequence of N output samples connected to the input samples by a linear relationship which can be represented by a square matrix of dimension N having coefficients equal to +1 or −1. The converter includes a charge transfer device comprising a plurality of electrodes disposed in lines; an input circuit capable of forming from an input signal sequences of N input samples, of converting each sample into bundles of charges and of injecting these bundles at appropriate moments under appropriate electrodes on the charge transfer device; a circuit for controlling the transfer of charges from one electrode to the next and doing so at a first frequency; a differential charge reader comprising two charge measuring circuits and a two-input differential amplifier, one non-reversing and the other reversing, each connected to one of the said measuring circuits, and an output, certain of the electrodes referred to as reading electrodes being connected to one or other of the two measuring circuits, each reading electrode thus providing a positive or negative contribution to formation of the signal furnished by the reader; and a circuit for forming output samples at a second frequency, from the signal furnished by the differential reader. The disposition of the electrodes and control of the moments of injection and of charge transfer under these electrodes is such that at any time when an output sample is formed, the N bundles of charges corresponding to the N input samples are situated under reader electrodes of which the respective signs correspond to the signs of the coefficients of the linear relationship which must link the said output sample with the said N input samples.

17 Claims, 13 Drawing Figures

HADAMARD CONVERTERS EMPLOYING CHARGE TRANSFER DEVICES

Figure 1:
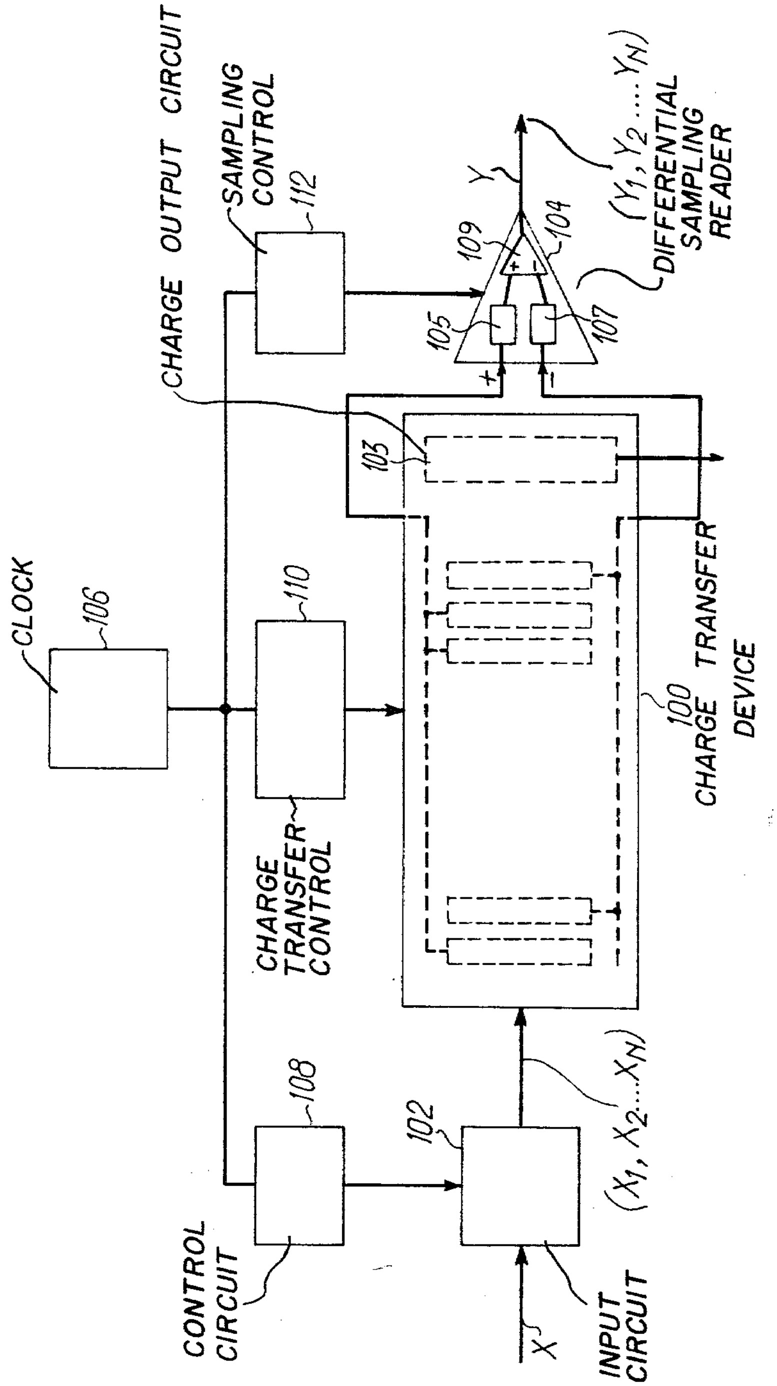

The present invention relates to a Hadamard converter employing charge transfer devices. It finds an application particularly in the transmission, recording and reproduction of television type images.

Hadamard conversion (likewise known as Walsh's conversion) is a linear conversion defined on the basis of a square matrix, the coefficients of which are equal to +1 or −1.

Methods have been found for constructing Hadamard matrices of dimension N, for various values of N, but the simplest methods are those which relate to N values equal to $2^n$ in which n is a whole number.

Indeed, if H is a Hadamard matrix of dimension N, the matrix:

$$G = \begin{bmatrix} H & H \\ H & -H \end{bmatrix}$$

is still a Hadamard matrix but of dimension 2N.

Thus, on a basis of the elementary matrix of dimension 2:

$$\begin{bmatrix} +1 & +1 \\ +1 & -1 \end{bmatrix} \quad (1)$$

it is possible successively to construct matrices of dimension, 4, 8 . . . $2^n$.

This construction method provides matrices referred to as being of natural form. But, by permutation of lines, it is possible also to obtain interesting matrices which are said to be of sequential form.

Hadamard matrices exhibit properties of symmetry and orthogonality. The result is that a Hadamard matrix, written in natural form, is equal to its reciprocal. Thus:

$$[H]\cdot[H]^{-1}=N[I]$$

in which [I] is the unit matrix of dimension N. This property is not generally verified in the case of matrices which are in sequential form.

More precisely, Hadamard conversion makes it possible to pass from one sequence of samples of a noted electrical signal $X_1, X_2 \ldots X_N$ to a sequence of so-called converted noted samples $Y_1, Y_2 \ldots Y_N$, via the following linear equation:

$$\begin{bmatrix} Y_1 \\ Y_2 \\ \cdot \\ \cdot \\ \cdot \\ Y_N \end{bmatrix} = H \cdot \begin{bmatrix} X_1 \\ X_2 \\ \cdot \\ \cdot \\ \cdot \\ X_N \end{bmatrix} \quad (2)$$

For example, the conversion working on sequences of four samples is written:

$$\begin{bmatrix} Y_1 \\ Y_2 \\ Y_3 \\ Y_4 \end{bmatrix} = \begin{bmatrix} +1 & +1 & +1 & +1 \\ +1 & -1 & +1 & -1 \\ +1 & +1 & -1 & -1 \\ +1 & -1 & -1 & +1 \end{bmatrix} \cdot \begin{bmatrix} X_1 \\ X_2 \\ X_3 \\ X_4 \end{bmatrix} \quad (3)$$

The Hadamard conversion is of considerable interest with reference to transmission, recording and reproduction of television type images because it makes it possible to compress the data to be transmitted. With regard to this application, the article by J. PONCIN entitled "Utilisation de la transformation de Hadamard pour le codage et la compression de signaux d'images" (Using Hadamard conversion for coding and compression of image signals) published in "Annales des Telecommunications", Vol. 26, No. 7-8, July-August 1971, pages 235 to 252 may be consulted.

Solutions have already been suggested with regard to the provision of devices capable of carrying out such conversion. In particular, these are analogue elastic surface wave devices. Where these are concerned, reference may be made to U.S. Pat. No. 4,245,330.

The drawback with these devices is that they make it necessary to work on a carrier signal modulated by the image signal and that they do not therefore make it possible directly to process the signal to be converted. The result is quite considerable complexity and problems of temperature-related frequency errors.

The present invention quite rightly relates to a Hadamard converter which does not have this drawback because it directly processes the signal which is to be converted.

To this end, the invention proposes using an analogue device serving as a conversion support a charge transfer device which is a device the principle of which is known per se, but of which the invention proposes a new application as well as original embodiments.

It is known that a charge transfer device is a semiconductor circuit in which a group of electrical signals is introduced at one end then moved by the action of operating voltages as far as another end at which it is finally picked up. Such a device is often used as a filter or as a delay line.

One of the best-known charge transfer devices is the charge coupled device or, in abbreviated form, C.C.D. Such a device comprises a doped semi-conductor substrate (p or n) covered with a thin insulating coating (around 0.1 microns in thickness), itself covered with regularly disposed conductive electrodes. Such systems therefore belong to the family of "MIS" (metal-insulant-semi-conductor) circuits. The charges which are stored and displaced are constituted by minority carriers held in potential bins created under some of the electrodes which are for the purpose raised to suitable potentials. To transfer these charges from one electrode to the next, the corresponding potential bin is displaced by altering the voltages applied to the electrodes. The direction of movement can be established by any suitable means: supplementary electrode, doped areas in the substrate, fixed charges, differing thicknesses of oxide, etc. . . . so that the potential bins have an asymmetric characteristic and so that transfer takes place in a unidirectional fashion.

Associated with this semi-conductor substrate, upstream in relation to the direction of charge flow, is an input circuit capable of creating bundles of charges and of injecting them into the substrate, and downstream, there is a circuit for detecting the said charges.

For more details concerning these known devices, reference may be made to the article by W. S. BOYLE and G. E. SMITH entitled "Charge Coupled Semi-Conductor Devices", published in the magazine "The Bell System Technical Journal", April 1970, pages 587 to 593, and to the work of Carlo H. SEQUIN and Michael F. TOMPSETT entitled "Charge Transfer Devices" published in 1975 by Academic Press Inc.

The invention proposes using devices of this type but in the following manner. An input circuit receives the signal X which has to be processed, converts it to periodic samples $X_1, X_2 \ldots X_N$ (if the input signal is not already sampled), then converts the value of each sample to a proportional bundle of electric charges. Each bundle of charges is at a suitable moment injected under the appropriate electrode of a charge transfer device which comprises a plurality of such electrodes disposed in line and/or in columns. These bundles of charges pass under the electrodes with the rhythm of a transfer clock. At all times, they represent the samples $X_1, X_2 \ldots X_N$.

In order to obtain a converted sample $Y_i$, it is necessary to carry out N linear operations of the form:

$$Y_i = \sum_{j=1}^{j=N} a_{ij} X_j \quad (4)$$

in which the coefficients $a_{ij}$ are the coefficients of the Hadamard matrix (see equation (2)). These operations are performed by a so-called "reader" differential circuit which has two inputs, a non-reversing input and a reversing input. The non-reversing input receives all the samples $X_j$ which have to be subjected to the coefficient +1 in the linear equation (4) and the reversing input all the samples subject to the coefficient −1. In other words, a first family of electrodes of the charge transfer device is connected to the reversing input of the reader while a second family is connected to the non-reversing input of the same reader. Naturally, some of the electrodes of the charge transfer device need not be connected to the reader. In order to distinguish the first from the second, it should be said that the electrodes connected to the reader are reading electrodes. It then remains to cause the bundles of charges to progress in a suitable fashion so that at any moment of formation of a converted sample $Y_i$, they are brought under the reading electrodes which are suitably connected to the reader for the signs of the contributions of these electrodes at the formation of the reading signal to correspond to the different signs in the equation (4). The output of the reader then delivers the sequence of converted samples.

Obviously, this result can be obtained only by a judicious disposition of the electrodes and by appropriate control of the sampling and transfer moments, which is precisely the object of the invention.

The use of charge transfer devices for the provision of a Hadamard converter may in certain respects recall the use of the same devices for obtaining transverse filters having cut electrodes. A description of such filters can be found in the work previously quoted, page 219. It must however be stressed that in the invention the electrodes used are not cut (because the coefficients of linear conversion to be carried out are all equal to unity), and that the constraints on the charge transfer and sampling moments are not the same as in a filter because, as it happens, it is important to carry out a conversion of a matrix nature, involving a plurality of linear equations which is not the case in a transverse filter in which a single linear conversion is carried out.

It must also be stated that charge transfer devices are known which make it possible to carry out matrix conversion on samples. French Patent Application No. 2382055 published on Sept. 22, 1978 and entitled "Dispositif de transformation de signaux" (Signal conversion device) describes a device of this type in which electrodes are cut in such a way as to define balance coefficients appropriate to the matrix conversion which is to be performed. Delay line systems are provided in order to introduce the samples into the lines of a matrix, each line being a cut grid charge transfer device.

Such a device is therefore highly complex and once again it has recourse to the cut grid principle.

The present invention makes it possible to get away from this principle and leads to a far simpler device. To be precise, the invention relates to a device for carrying out a Hadamard conversion on periodic sampled signals, this conversion bringing about correspondence between a sequence of N input samples and a sequence of N output samples connected to the first by a linear relationship which can be represented by a square matrix of dimension N having coefficients equal to +1 or −1, characterised in that it comprises:

- a charge transfer device comprising a plurality of electrodes disposed in lines and/or in columns;
- an input circuit capable of forming from an input signal sequences of N input samples, of converting each sample into bundles of charges and of injecting these bundles at appropriate moments under appropriate electrodes on the charge transfer device;
- a circuit for controlling the transfer of charges from one electrode to the next and doing so at a first frequency;
- a differential charge reader comprising two charge measuring circuits and a two-input differential amplifier, one non-reversing and the other reversing, each connected to one of the said measuring circuits, and an output, certain of the electrodes referred to as reading electrodes being connected to one or other of the two measuring circuits, each reading electrode thus providing a positive or negative contribution to formation of the signal furnished by the reader;
- a circuit for forming output samples at a second frequency, from the signal furnished by the differential charge reader, the disposition of the electrodes and control of the moments of injection and of charge transfer under these electrodes being such that at any time when an output sample is formed, the N bundles of charges corresponding to the N input samples are situated under reader electrodes of which the respective signs correspond to the signs of the coefficients of the linear relationship which must link the said output sample with the said N input samples.

Figure 4:
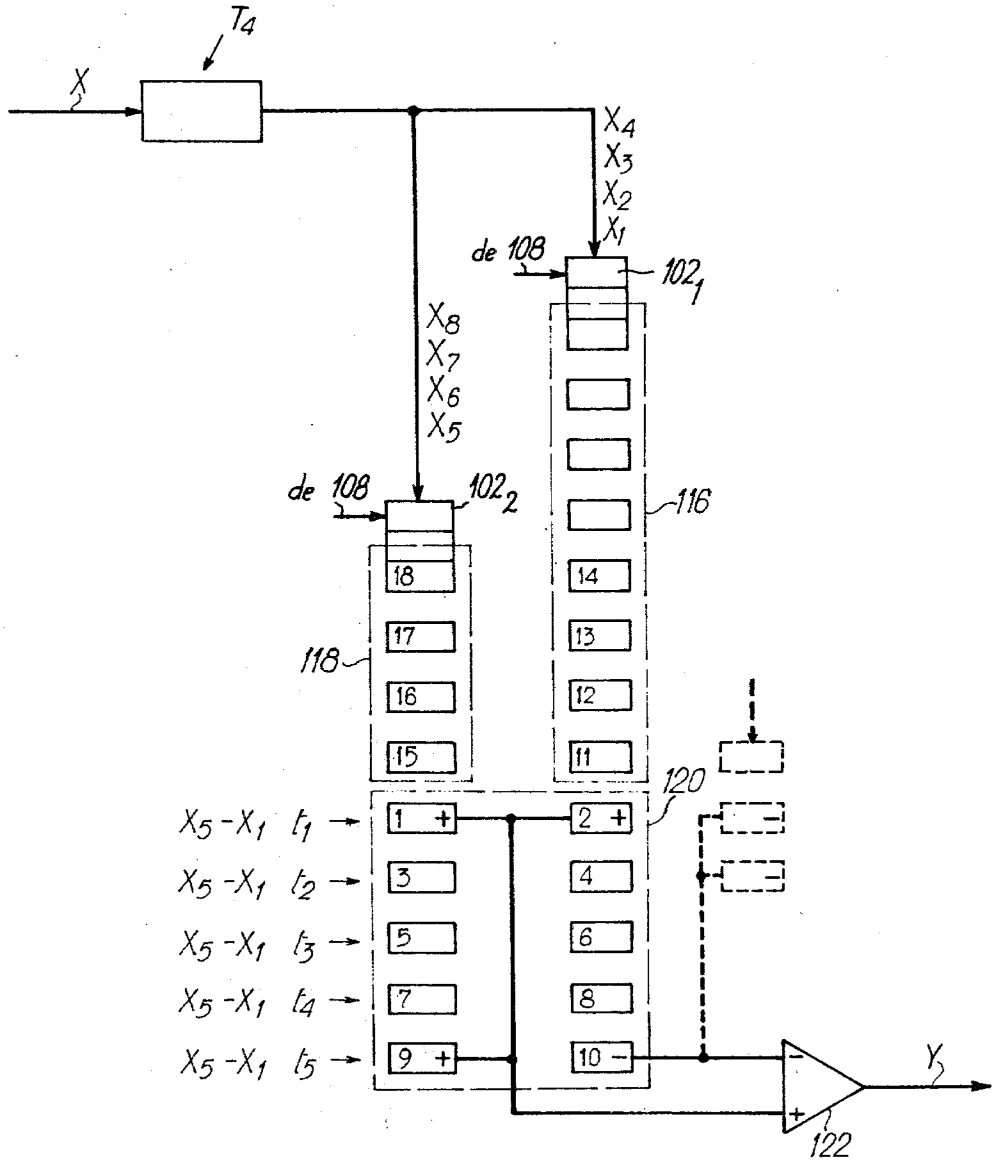
Figure 5:
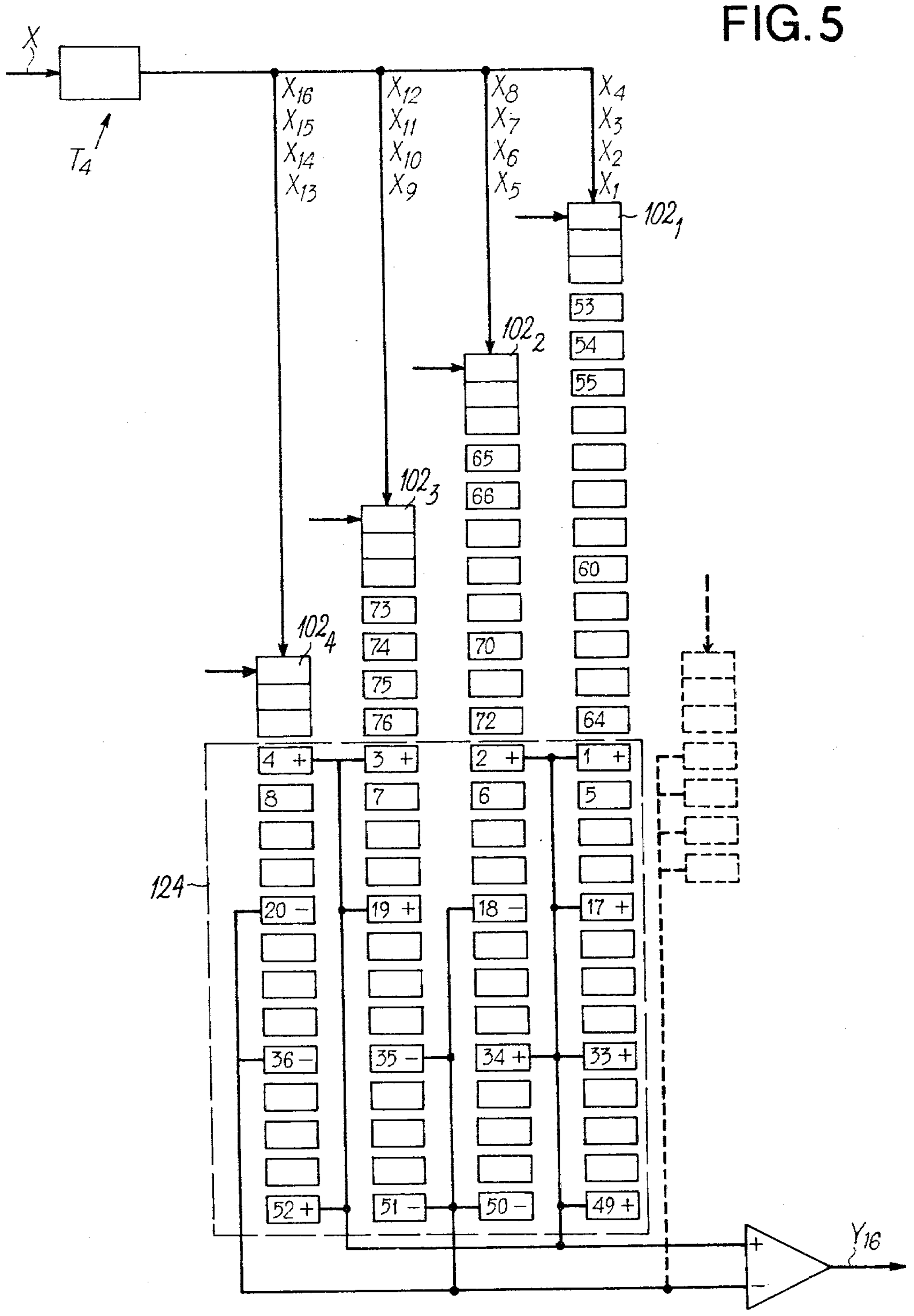

In any event, the characteristic features and advantages of the invention will become more clearly apparent from the ensuing description of embodiments which are given by way of explanation and which imply no limitation. This description relates to drawings in which:

FIG. 1 shows a block diagram of the device according to the invention;

FIG. 2*a* represents a first embodiment of a 4-point converter having electrodes in series and FIG. 2*b* a chronogram of the converter;

FIG. 3*a* represents another embodiment of a 4-point converter in which the electrodes are in a parallel-series configuration; and FIG. 3*b* a chronogram of the converter;

FIG. 4 diagrammatically shows a device which makes it possible to obtain an 8-point conversion from a 4-point converter;

FIG. 5 diagrammatically shows a device which makes it possible to obtain a 16-point conversion from a 4-point converter;

FIGS. 6*a* and 6*b* represent in the case of a 2-point converter an embodiment comprising a small number of electrodes;

FIG. 6*a* showing the direct converter and FIG. 6*b* the reverse converter, while FIGS. 6*c* and 6*d* show the chronograms for the direct and reverse converter, respectively.

Figure 8:
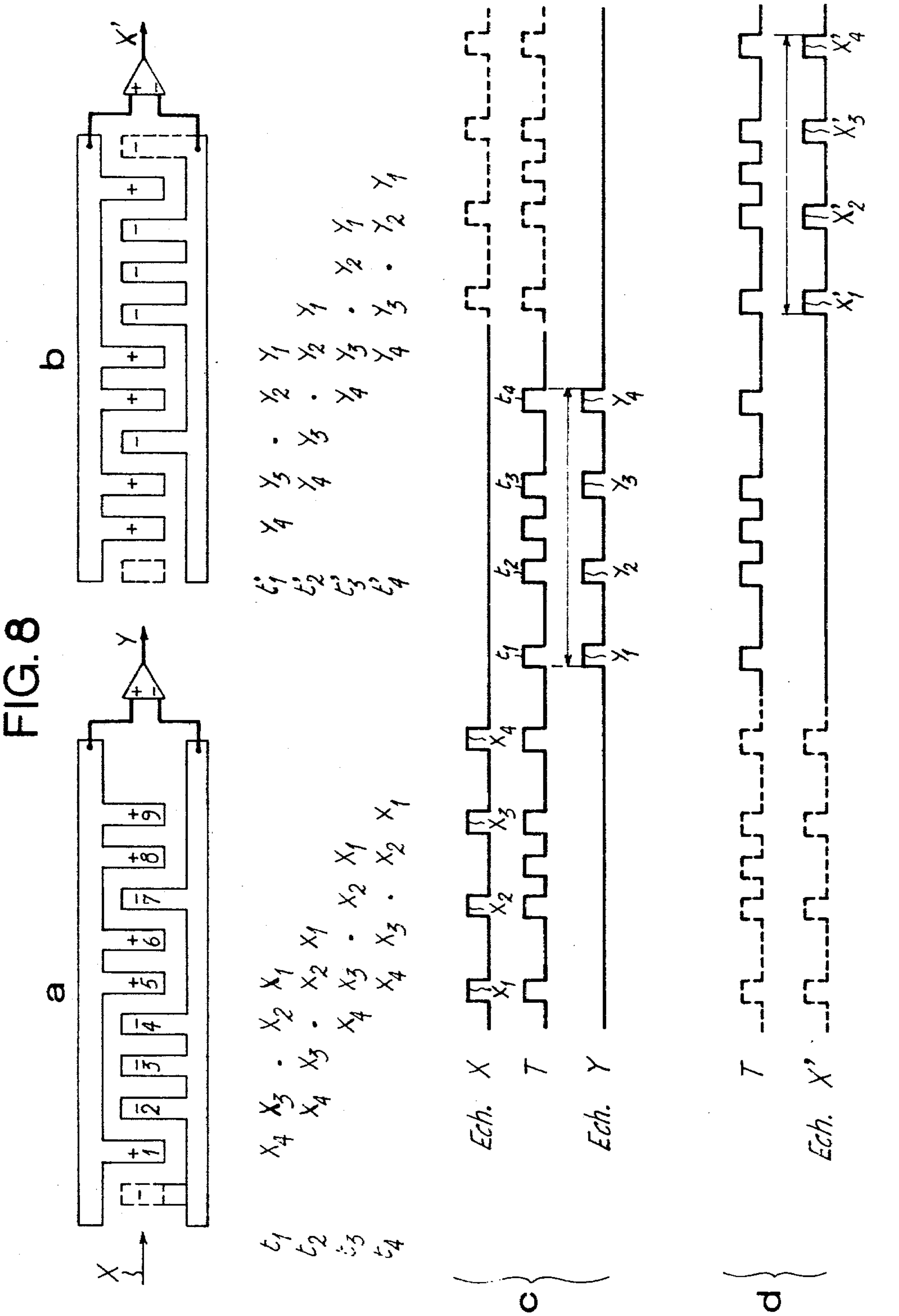
Figure 12:
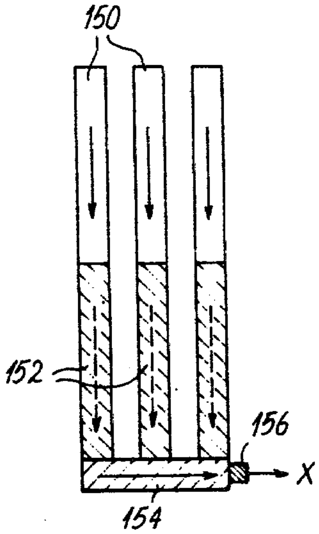

FIG. 7*a* represents an embodiment of a 4-point converter which requires only 9 electrodes and which is based on an orthogonal matrix; and FIG. 7*b* shows the chronogram of the converter;

FIGS. 8*a* and 8*b* represent an embodiment of two symmetrical 4-point converters based on a pair of symmetrical matrices; and FIGS. 8*c* and 8*d* represent their chronograms;

FIGS. 9*a* and 9*b* represent another embodiment of a pair of 4-point converters; and FIGS. 9*c* and 9*d* their chronograms;

FIG. 10*a* diagrammatically shows an embodiment of an 8-point converter constructed from a 4-point converter according to FIG. 8; and FIG. 10*b* shows the chronogram of the converter;

FIGS. 11*a* and 11*b* show a particular embodiment of an 8-point converter employing two or three stage devices, respectively;

FIG. 12 represents a DTC image analyzer according to the prior art, and

FIG. 13*a* represents a Hadamard converter according to the invention and integrated into a DTC image analyzer, and FIG. 13*b* shows its chronogram.

In the description which follows and in order to reduce the volume of notations, only the sign of the coefficients of matrices defining the conversions carried out will be considered, thus omitting the unitary value of these coefficients. In the same way and in order to simplify terminology, it will be said of each reading electrode that it is positive or negative according to whether its contribution to the formation of the reading signal is itself positive or negative.

The device shown diagrammatically in FIG. 1 comprises a charge transfer device 100 which is supplied by an input circuit 102 receiving an input signal X and which is provided with a charge output circuit 103. Some of the electrodes of the device 100 are connected to a differential sampling reader 104 which delivers a reading signal Y. A clock 106 simultaneously times a circuit 108 for controlling the circuit 102, a circuit 110 for controlling the charge transfer in the device 100 and a circuit 112 for controlling sampling of the output signal Y.

The operating principle of this device is as follows. The input circuit 102 receives the signal X which is to be processed, converts this signal into sequences of N samples $X_1, X_2 \ldots X_N$ and translates these samples into bundles of electrical charges. The circuit 108 is capable of generating pulses to control this sampling and the injection of the bundles of charges into the charge transfer device 100. This device collects these bundles of charges and transfers them under its electrodes, doing so at the same rate as the transfer pulses delivered by the circuit 110. These charges are then extracted by the output circuit 103. The reader 104 reads the charges stored under the electrodes to which its inputs are connected, such reading being carried out at N moments defined by the circuit 112. These moments are those when the bundles of charges representing the samples $X_1, X_2 \ldots X_N$ are disposed under the electrodes, the signs of which correspond to one of the N linear relations of the type (4) corresponding to the matrix H of conversion (2). The output of the amplifier 104 therefore delivers successively the N samples $Y_1, Y_2 \ldots Y_N$ converted from $X_1, X_2 \ldots X_N$ by the matrix H.

As the circuits 102, 103, 104, 106, 108, 110 and 112 are known and are described in particular in the work previously quoted, they will not be detailed in the description which is to follow. It may be stated simply that the differential reader 104 comprises two charge measuring circuits 105 and 107 and a differential amplifier 109 having two inputs, one reversing, the other not. The measuring circuits 105 and 107 operate by using either current intensity or voltage. With regard to the output circuit 103, this may be a polarized diode associated with an operating grid.

The description will therefore relate solely to the structure of the electrodes of the charge transfer device 100. Furthermore, this description will exclude certain well-known means in charge transfer devices such as the control lines, the means of ensuring unidirectionality of the charge transfer, the nature of the semi-conductor substrate, etc. For all these details of design, reference may be made to the previously mentioned work. Similarly, to simplify the drawings, the output circuit 103 will be omitted and the reading circuit 104 will be represented as a whole with two inputs provided with a + or − sign according to whether these inputs are connected via one of the charge measuring circuits to the non-reversing input or to the reversing input of the differential amplifier.

Figure 2:
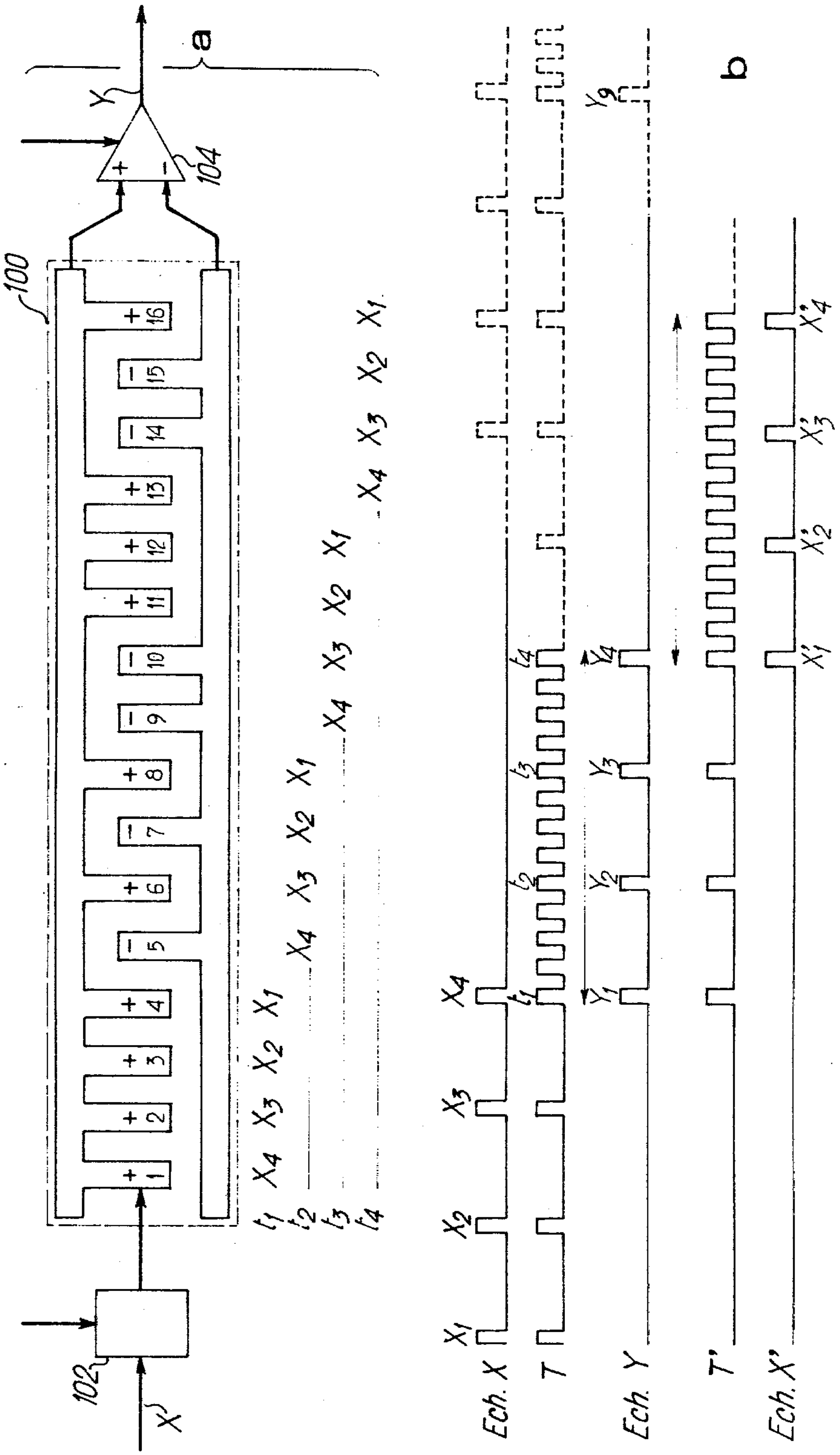

FIG. 2 first of all illustrates a first embodiment of a 4-point converter which makes it possible to carry out the conversion defined by the 4-row Hadamard matrix stipulated previously by the equation (3). The part (a) of this drawing illustrates the distribution of the electrodes in the charge transfer device and part (b) represents a chronogram which explains the operation of this device.

The device shown in part (a) comprises a charge transfer device having 16 reading electrodes (identified in a row extending from 1 to 16); these electrodes are disposed in series on one and the same line and they are distributed into four groups each of four electrodes; the sequence of signs of the electrodes in one group (going from left to right) is identical to the opposite sequence (that is to say when reading from right to left) of signs of one line of the matrix representing conversion (matrix (3)). The input circuit 102 injects bundles of charges under the first electrode of the first group and the output circuit (not shown) extracts them from the last electrode. The reader 104 carries out differential reading of the charges situated under the electrodes to which it is connected.

The detailed operation of this device is as follows. At the instance $t_1$ charges proportional to the samples of inputs $X_1$, $X_2$, $X_3$, $X_4$ are stored respectively under electrodes 4, 3, 2, 1 of signs +, +, +, +; this situation is represented by symbolically under the device 100; at this instant in time, therefore, there is at the output of the reader 104 a signal $+X_1$, $+X_2$, $+X_3$, $+X_4$ which therefore corresponds to the first sample $Y_1$ of the signal converted by the matrix (3).

At the moment $t_2$ the charges $X_1$, $X_2$, $X_3$, $X_4$ are situated under the electrodes 8, 7, 6, 5 of respective signs +, −, +, − and a signal $+X_1 - X_2 + X_3 - X_4$ which corresponds to the second sample $Y_2$ of the converted signal is obtained at the output from the reader.

At the moment $t_3$, the third sample $Y_3$ is obtained in the same way and the fourth $Y_4$ is obtained at $t_4$.

In the chronogram in part (b), the first line marked Ech.X corresponds to the sampling control pulses of the input signal X, the second line marked T corresponds to the transfer pulses and the third, marked EchY corresponds to the sampling control pulses of the output signal Y. The period of calculation of the converted samples extends between moments $t_1$ and $t_4$ (period marked by an arrowed segment). It can be seen that the period of transfer is not constant but must assume a minimal value during the period of calculation. This assumes that the clock is of a sufficiently high frequency to be able to generate transfer pulses at this minimal period.

As the device shown can only process one group of four samples and as it cannot receive further samples during this processing, it is necessary to provide two identical devices disposed in parallel and working alternately on successive groups of four samples. This point will be illustrated in FIG. 11.

As the Hadamard matrix employed is equal to its opposite, the device shown in FIG. 2 is likewise capable of bringing about opposite conversion from that described, which results in passing from samples $Y_1$, $Y_2$, $Y_3$, $Y_4$ to samples $X_1'$, $X_2'$, $X_3'$, $X_4'$ identical to the input samples $X_1$, $X_2$, $X_3$, $X_4$.

For this opposite conversion, the transfer command pulses are indicated on the fourth line (marked T') of the chronogram in part (b), (in which the period of calculation of the opposite conversion is again identified by an arrowed segment) and the output signal sampling pulses are on the last line marked EchX'.

The converter illustrated in FIG. 2 has two drawbacks:

the pilot frequency controlling the transfer circuit must be four times greater than the sampling frequency (and N times in the case of N-point conversion) or, which amounts to the same, the minimum transfer period must be equal to the sampling period divided by 4 (or by N);

it requires charge transfer devices having 16 electrodes (or more generally having $N^2$ electrodes).

The invention therefore proposes other alternatives in which one or the other of these drawbacks is alleviated, in other words where the minimum transfer period is greater than 1/N times the sampling period, or where the number of electrodes is less than $N^2$. These various alternatives will now be described, commencing with those in which the minimum transfer period is increased (FIGS. 3 to 5), finishing with the alternatives which have a small number of electrodes (FIGS. 7 to 11).

Figure 3:
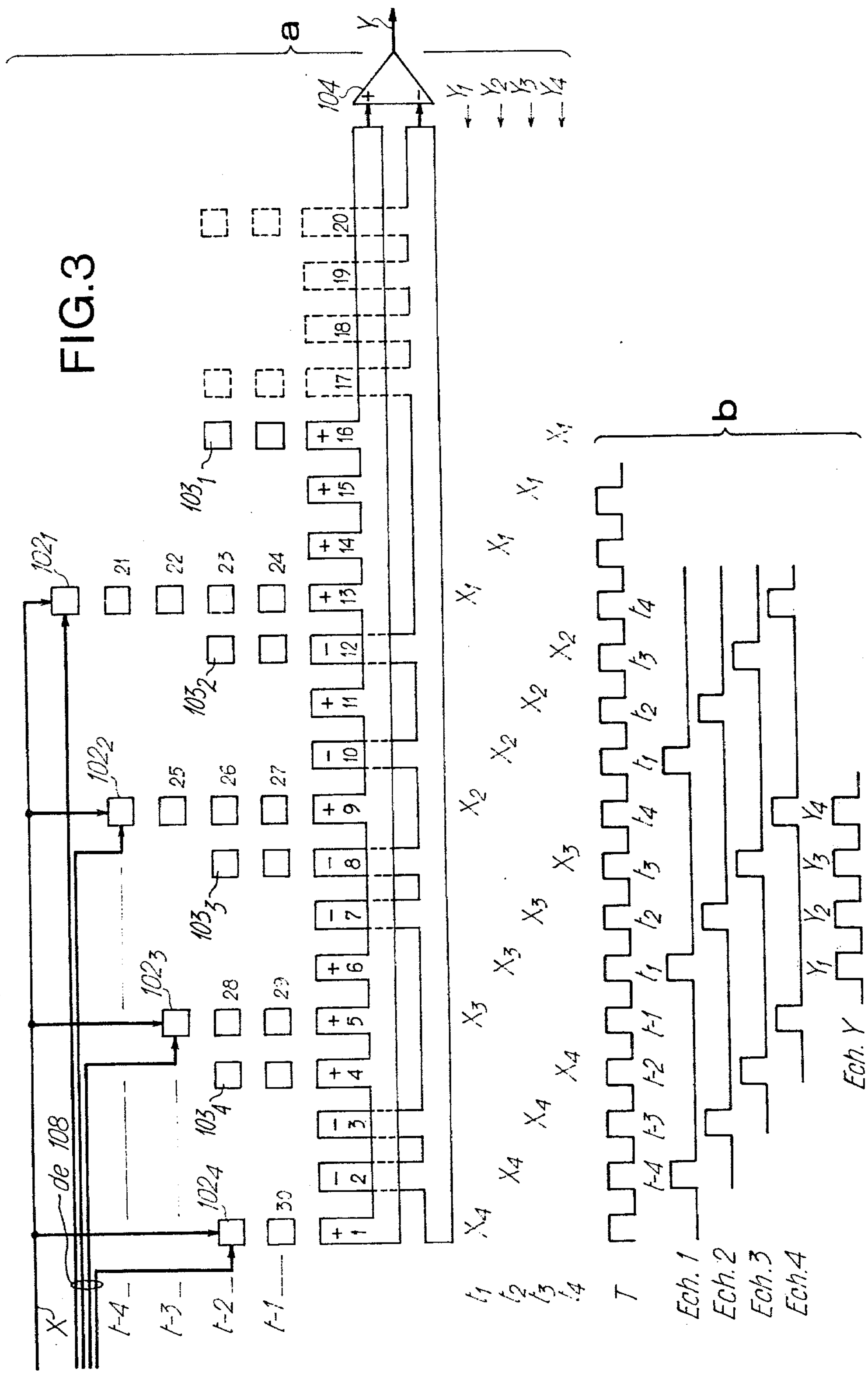

The device shown in part (a) of FIG. 3 of the drawing makes it possible to achieve 4-point conversion, which is again defined by the matrix of equation (3).

The charge transfer device employed comprises:

(a) on the one hand 16 reading electrodes numbered 1 to 16 and divided into four groups of 4, the sequence of signs of the electrodes belonging to one and the same group being identical to the sequence of signs of the coefficients of a column of the matrix representing the conversion. Thus, in this alternative and in contrast to that in FIG. 2, the coefficients of the Hadamard matrix are taken into account column by column and no longer line by line. First come the signs of the fourth or last column (+, −, −, +) then those of the third (+, +, −, −), those of the second (+, −, +, −) and finally those of the first (+, +, +, +). It is quite obvious that the order in which the columns are overall implanted is immaterial. On the other hand, within each group the respective order of signs must be the same as in a column of the matrix because it is necessary for the various samples to arrive at the same moment under the appropriate electrodes corresponding to these signs;

(b) on the other hand, four columns of electrodes in parallel, the $i^{th}$ column comprising i electrodes; this $i^{th}$ column is disposed opposite the first electrode of the $i^{th}$ group of reading electrodes (a); in other words, the fourth column going from left to right comprises 4 electrodes (21, 22, 23, 24), the third comprises 3 (25, 26, 27), the second 2 (28, 29) and the first only 1 (30). Electrode 24 of the fourth column is opposite the electrode 13, the first in the fourth group, electrode 27 is opposite electrode 9, first in the third group, etc.

Where the input circuit is concerned, it comprises four independent elements $\mathbf{102_1}$, $\mathbf{102_2}$, $\mathbf{102_3}$, $\mathbf{102_4}$ placed at the head of the four columns of electrodes, these four inputs simultaneously receiving the input signal X. These input elements are operated in turn starting with the fourth and finishing with the first, by signals emanating from the control circuit 108, not shown.

With regard to the output circuits, these respectively comprise output diodes $\mathbf{103_1}$, $\mathbf{103_2}$, $\mathbf{103_3}$, $\mathbf{103_4}$.

This device operates in the following way.

At the instant $t_{-4}$ the sample $X_1$ is under the electrode 21; at $t_{-3}$ the sample $X_1$ passes under the electrode 22 and the sample $X_2$ under the electrode 25; at $t_{-2}$, $X_1$ progresses under the electrode 23, $X_2$ under the electrode 26 and $X_3$ under the electrode 28; finally, at $t_{-1}$, $X_1$ is under 24, $X_2$ under 27, $X_3$ under 29 and $X_4$ under 30.

At the moment $t_1$ the samples leave the electrodes in columns and pass under the reading electrodes in line, identified from 1 to 16; at $t_1$, $X_1$ is under the electrode 13, $X_2$ is under 9, $X_3$ is under 5 and $X_4$ is under 1. At the output of the reading circuit 104, a signal $X_1+X_2+X_3+X_4$ is obtained, which is then the converted sample $Y_1$; at $t_2$, the samples $X_1$, $X_2$, $X_3$, $X_4$ have progressed by one electrode and are again respectively found under electrodes 14, 10, 6 and 2 of signs + − + − and the sample $Y_2$ is obtained; then, in the same way, at $t_3$, $Y_3$ is obtained while $Y_4$ is obtained at $t_4$. The cycle then recommences for the four following samples.

The chronogram in part (b) of FIG. 3 stipulates the various phases of operation of the device in part (a); the first line marked T gives the transfer pulses, the four following lines marked Ech1, Ech2, Ech3, Ech4 indicate the sampling pulses applied respectively to the four input elements $\mathbf{102_1}$, $\mathbf{102_2}$, $\mathbf{102_3}$, $\mathbf{102_4}$; the last line, marked EchY gives the pulses for sampling the output signal Y and consequently the moments at which the converted samples $Y_1$, $Y_2$, $Y_3$ and $Y_4$ are obtained.

On this chronogram, it will be noted that the moments $t_{-4}$, $t_{-3}$, $t_{-2}$, $t_{-1}$ must correspond respectively to $t_1$, $t_2$, $t_3$, $t_4$ of the preceding cycle and so on, so that the successive samples, taken in groups of 4, give the four corresponding converted samples in cyclic fashion.

In this solution, only one device is needed to carry out direct conversion and not two as in the solution shown in FIG. 2.

It will also be noted in this operation that the transfer and sampling frequencies are the same, which is one of the advantages announced in comparison with the alternative shown in FIG. 2.

In the diagram in part (a) of FIG. 3, electrodes are represented by broken lines, for respective rows 17, 18, 19, and 20. These are balancing electrodes intended to make the number of negative electrodes equal to the number of positive electrodes. This question will be taken up again later.

Although a converter can be designed so that it can carry out an 8-point conversion directly, such a conversion can nevertheless be obtained in two stages using a 4-point converter followed by a linear 4→8 point converter. The principle of this 2-stage conversion is based on the property which is offered by a Hadamard matrix of size 2 N of resulting from Hadamard matrix of dimension N by multiplication by a matrix of which the coefficients are all equal to +1, −1 or 0. In the case of matrices of dimensions 8 and 4, the relationship is as follows:

$$\begin{bmatrix} + & + & + & + & + & + & + & + \\ + & - & + & - & + & - & + & - \\ + & + & - & - & + & + & - & - \\ + & - & - & + & + & - & - & + \\ + & + & + & + & - & - & - & - \\ + & - & + & - & - & + & - & + \\ + & + & - & - & - & - & + & + \\ + & - & - & + & - & + & + & - \end{bmatrix} = \tag{5}$$

$$\begin{bmatrix} + & & & & + & & & \\ & + & & & & + & & \\ & & + & & & & + & \\ & & & + & & & & + \\ + & & & & - & & & \\ & + & & & & - & & \\ & & + & & & & - & \\ & & & + & & & & - \end{bmatrix} \cdot \begin{bmatrix} + & + & + & + & & & & \\ + & - & + & - & & & & \\ + & + & - & - & & & & \\ + & - & - & + & & & & \\ & & & & + & + & + & + \\ & & & & + & - & + & - \\ & & & & + & + & - & - \\ & & & & + & - & - & + \end{bmatrix}$$

In the multiplier matrix, all the coefficients left blank are zero. In the first matrix will be found that of equation (5) and in the second matrix a matrix formed from the Hadamard matrix of dimension 4 given by the equation (3).

The device modelled on this matrix operation is shown in FIG. 4.

It comprises a device $T_4$ operating on four samples according to any one of the alternative embodiments described by FIGS. 2 and 3, followed by a linear 4→8 point converter comprising:

(a) on the one hand, two columns of electrodes 116 and 118 comprising respectively 8 and 4 electrodes, each of these columns being provodid with an input circuit 102$_1$ and 102$_2$ receiving groups of four samples from the device $T_4$ preceding it; the four last electrodes in the column 116 are identified by reference numerals 11 to 14 and those of column 118 are identified by reference numerals 15 to 18;

(b) on the other, an assembly 120 of two columns of 5 electrodes, each of these columns being in the alignment of columns 116 and 118; these electrodes are identified by reference numerals 1 to 10. Electrodes 1, 2 and 9 are connected to the positive input of a differential reader 122 constituted, in the same way as the reader 102 already encountered, by a differential amplifier and two charge measuring circuits; the electrode 10 is connected to the negative inputs of this amplifier. It will be seen therefore that the assembly 120 copies the coefficients of the multiplier matrix of the equation (6), the two signs + + of the four lines of the upper half corresponding to the signs + + of the electrodes 1 and 2 and the signs + − of the four lines of the lower half corresponding to the signs + − of the electrodes 9 and 10.

This circuit functions in the following way.

The samples ($X_1$, $X_2$, $X_3$, $X_4$) then ($X_5$, $X_6$, $X_7$, $X_8$) delivered by the 4-point converter $T_4$ are respectively under electrodes 11 to 14 and 15 to 18 after eight transfer clock cycles. At the instant $t_1$, the samples $X_1$ and $X_5$, memorised under electrodes 11 and 15, are transferred in parallel to below electrodes 1 and 2; at the output from the reader 122, a signal $X_1+X_5$ is obtained, that is to say the first of the converted samples from a group of 8, i.e. the sample $Y_1^8$; during this time, the samples stored under the two columns 116 and 118 have progressed by one row and $X_2$ and $X_6$ are in turn underneath electrodes 11 and 15. At the following clock cycle, at $t_2$, $X_2$ and $X_6$ are transferred under electrodes 1 and 2 and at the output of the reader 122 a signal $X_2+X_6$, in other words $Y_2^8$; then, in the same way $Y_3^8$ at $t_3$ and $Y_4^8$ at $t_4$. This part of the operation corresponds to the first four lines of the multiplier matrix of equation (6).

At $t_5$, the samples $X_1$ and $X_5$ which were under electrodes 7 and 8, reach electrodes 9 and 10; then the sample $Y_5^8$ is obtained; then, when $X_2$ and $X_6$ are transferred under these same electrodes 9 and 10, the sample $Y_6^8$ and in the same way $Y_7^8$ and $Y_8^8$. These four operations correspond to the last four lines of the multiplier matrix.

It will be observed that the electrodes of the converter 120 do not all play the same part. Only the electrodes 1, 2, 9 and 10 are active, the electrodes 3 to 8 play only a temporary memory role. This is due to the fact that the linear conversion matrix operating on the matrix of dimension 4, has certain coefficients equal to +1 and −1 and other which are zero.

It will also be noted tht the electrodes 11 to 18 are not compulsory. They only serve to simplify the timing diagram in this case of direct and opposite series conversion.

It is possible on this principle to build a 16-point converter from a 4-point converter. The corresponding diagram is shown in FIG. 5. Its structure is similar to that of the previous device, except for the fact that it has four columns for the input of samples instead of two and a linear converter 124 having 16 active electrodes instead of 4. The samples $X_1 \ldots X_{16}$ are applied to the four columns of the device in such a way that the sequences of four samples ($X_1$, $X_5$, $X_9$, $X_{13}$); ($X_2$, $X_6$, $X_{10}$, $X_{14}$) . . . are found respectively under the active electrodes of the linear converter (1, 2, 3, 4) then (17, 18, 19, 20), etc. The linear combination of these samples, four by four, occurs only on the electrodes connected to the output amplifier, the intermediate electrodes which are not connected to this amplifier only acting as a temporary memory.

At the instant $t_1$, the samples $X_1$, $X_5$, $X_9$ and $X_{13}$ are under electrodes 1, 2, 3, 4 and the sample $Y_1^{16}$ is obtained at the output from the reading circuit.

At the instant $t_2$, it is samples $X_2$, $X_6$, $X_{10}$ and $X_{14}$ which are located under the same electrodes and $Y_2^{16}$ is obtained; then in the same way and successively $Y_3^{16}$ and $Y_4^{16}$.

At the instant $t_5$, the samples $X_1$, $X_5$, $X_9$ and $X_{13}$ arrive under the electrodes 17, 18, 19 and 10 and then the sample $Y_5^{16}$ is obtained; then, respectively at instants $t_6$, $t_7$ and $t_8$, the samples $Y_6^{16}$, $Y_7^{16}$ and $Y_8^{16}$.

In the same way, when the samples $X_1$, $X_5$, $X_9$ and $X_{13}$ pass under electrodes 33, 34, 35 and 36, $Y_9^{16}$ is obtained and then respectively $Y_{10}^{16}$, $Y_{11}^{16}$ and $Y_{12}^{16}$; finally, when they arrive under electrodes 49, 50, 53, 52, $Y_{13}^{16}$ is obtained and then successively $Y_{14}^{16}$, $Y_{15}^{16}$ and $Y_{16}^{16}$.

The advantage of proceeding in several stages in order to achieve multi-point conversion is as follows. If it is desired to carry out 16-point conversion in a single stage, it is necessary to use a device having at least 272 electrodes ($16^2+16$). Of these electrodes, 256 electrodes are connected to the reading circuit and of these 16 are simultaneously active. If a 2-stage procedure is adopted, it is possible to make do with a 4-point converter having 20 electrodes, of which 16 are reading electrodes, of which 4 are simultaneously active, and a linear converter making it possible to change from 4 to 16 points, this latter having 65 electrodes, of which 16 are reading electrodes, of which 4 are active.

The advantages obtained are therefore achieved at two levels:

reduced complexity of the circuit in the case of the 2-stage device and therefore a better level of productivity ratio of number of active electrodes to the number of reading electrodes changing from 1:16 in the case of the direct conversion to 2 times 1:4 in the case of 2-stage conversion, therefore greater or even better dynamic ratio of effective signal to parasite signal.

Naturally, these advantages become all the more marked as the number of points increases.

In all the embodiments which have been described, the number of electrodes used, which is always large and at least equal to $N^2$, has been a matter for little concern. In the alternative embodiments of the invention which will now be presented, every endeavour will in contrast be made to reduce this number to the minimum. These alternatives are illustrated in FIGS. 6 to 11, firstly in the case of 2 points, then 4 points and then in the general case of 2 points.

Figure 11:
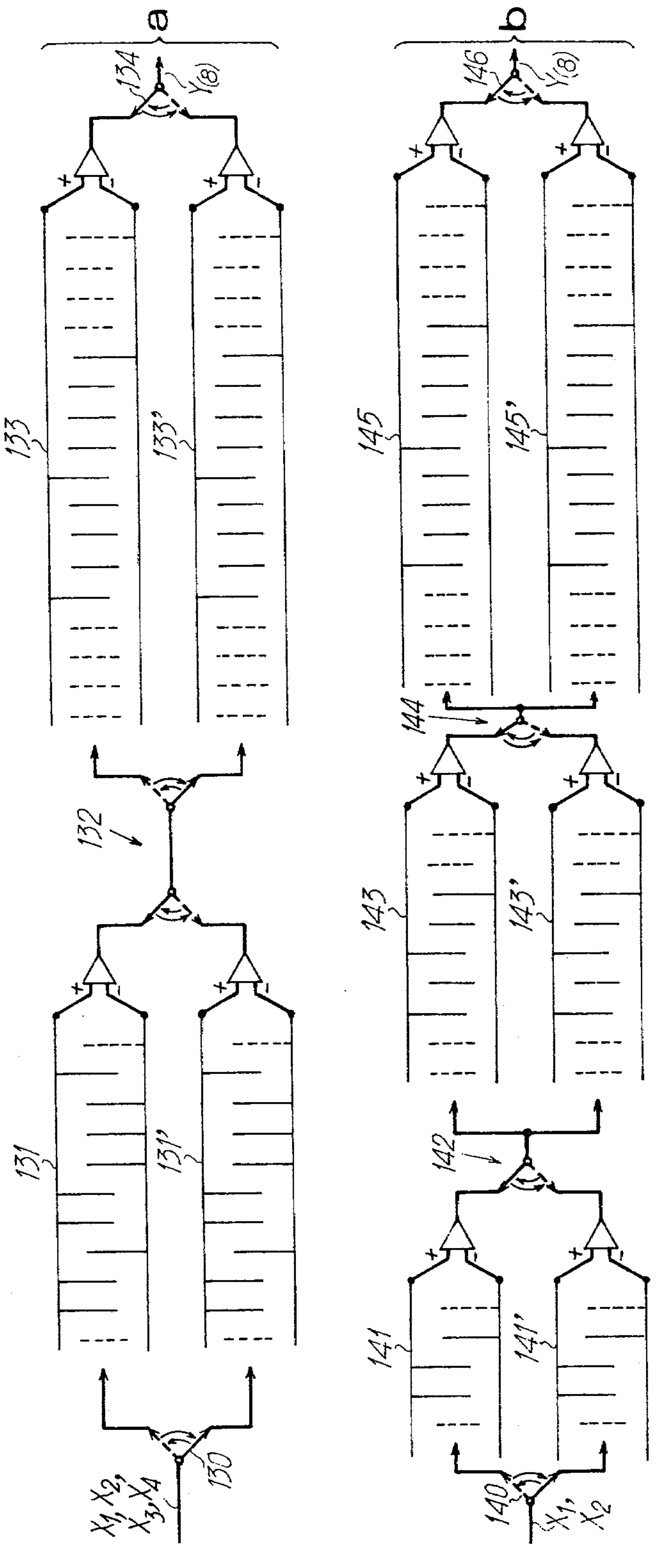

For these solutions, it is necessary to provide two devices working in sequence as shown diagrammatically in FIG. 11, which is not the case for the solutions corresponding to FIGS. 3 to 5.

The Hadamard matrix of dimension (2), given by equation (1) does not lend itself in this natural form to the provision of a charge transfer device with a small number of electrodes. According to the invention, conversions are then considered which are represented by slightly different matrices obtained by permutation of the order of lines of a Hadamard matrix written in a natural form, the relative sign of the lines possibly being reversed (coefficients of one and the same line multipled by $-1$). Obviously, such matrices are generally no longer orthogonal, so that they are no longer equal to their opposite. It is then necessary to consider pairs of matrices, one characterising direct conversion and the other reverse conversion. These pairs of matrices make it possible to construct pairs of converters, one for direct conversion, the other for reversed conversion.

In the case of a 2-point conversion arrangement, first of all, the invention proposes two devices based on the following pair of matrices:

$$H_0 = \begin{bmatrix} + & + \\ - & + \end{bmatrix} \quad (6) \qquad H_0^{-1} = \begin{bmatrix} + & - \\ + & + \end{bmatrix} \quad (7)$$

Figure 6:
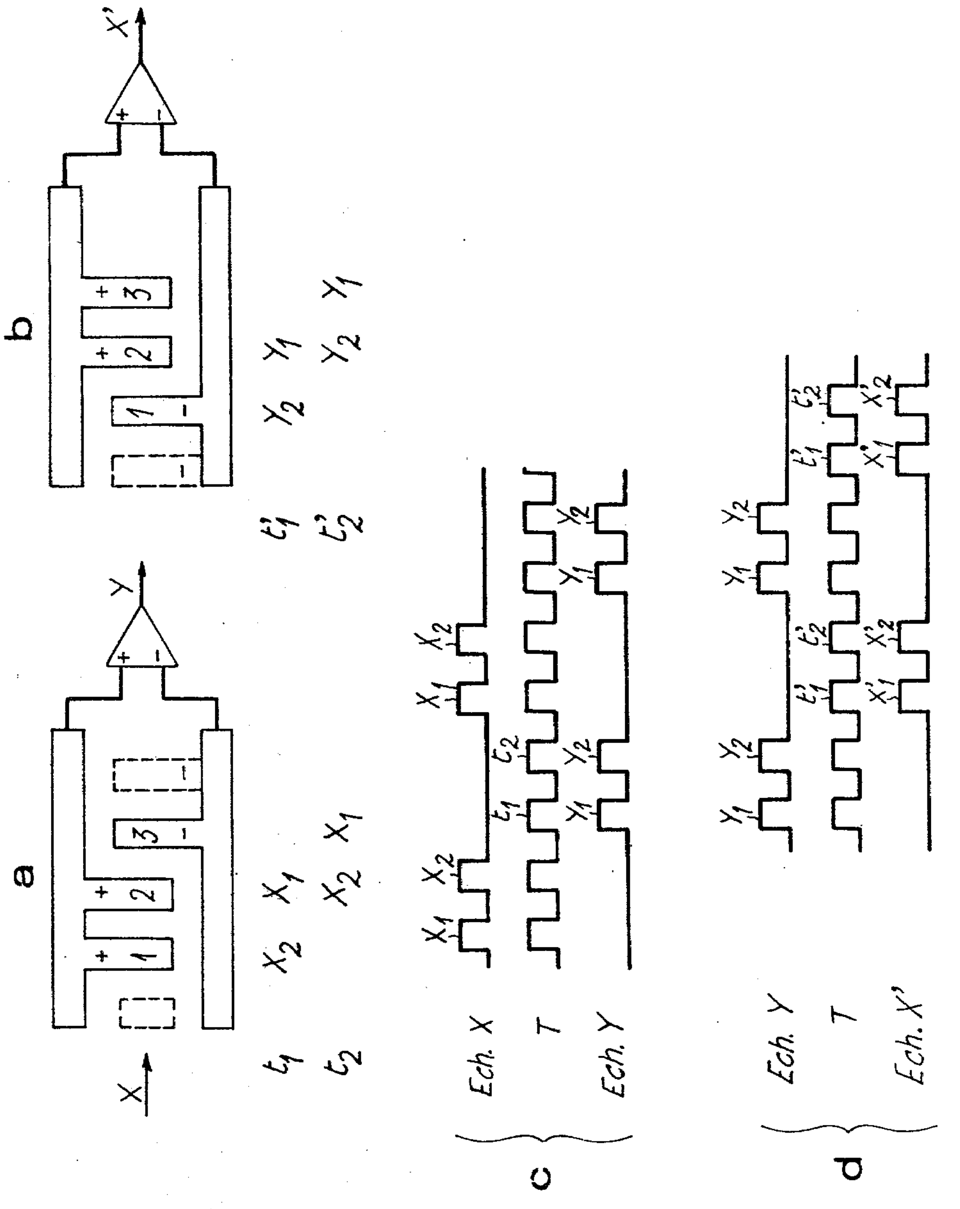

These devices are shown in FIG. 6. Part (a) gives the device providing direct conversion corresponding to $H_0$ and part (b) shows the device for reverse conversion corresponding to $H_0^{-1}$; as can be seen, these two devices require only three electrodes (instead of $N^2=4$). For the first, the signs of these electrodes are respectively $+ + -$ and for the second $- + +$; part (c) shows the chronogram of the direct converter (a) and part (d) the chronogram of the reverse converter (b). On these chronograms and according to notations already used, the first line EchX indicates the moments of sampling of the input signal X, the line T the moments of charge transfer from one electrode to the next, the line EchY the moments when the converted samples are obtained, and the like EchX' the moments when the converted samples are obtained from already converted samples.

Functioning of the device in part (a) is as follows: at the moment $t_1$, two samples $X_1$ and $X_2$ are under electrodes 2 and 1, both positive. Therefore, at this moment, the sample $Y_1=X_1+X_2$ is obtained. At the moment $t_2$, the samples $X_1$ and $X_2$ are placed under electrodes 3 and 2, respectively negative and positive and the sample $Y_2=-X_1+X_2$ is obtained. It will be observed that the transfer frequency is the same as the sampling frequency.

As the device in part (b) is symmetrical to the device in part (a), its functioning is similar. The samples $Y_1$ and $Y_2$ replace the input samples $X_1$ and $X_2$, the instants $t_1'$ and $t_2'$ replacing the instruments $t_1$ and $t_2$ and the samples $X_1'$ and $X_2'$ replacing the output samples $Y_1$ and $Y_2$.

In the case of a 4-point conversion, and with the same thought in mind, the invention proposes quite a series of devices which can be made up using electrodes disposed in line. First of all, a few particular devices will be described and then a means of finding all matrices of fourth or higher rank will be given, making it possible to construct a device with a small number of electrodes.

A particularly interesting matrix from this point of view is the following orthogonal matrix:

$$H_{orth.} = \begin{bmatrix} - & + & - & + \\ + & - & - & + \\ - & - & - & - \\ + & + & - & - \end{bmatrix} \qquad (8)$$

Except for a multiplier coefficient, which as it happens is equal to 4, this matrix is its own opposite:

$$\begin{bmatrix} - & + & - & + \\ + & - & - & + \\ - & - & - & - \\ + & + & - & - \end{bmatrix} \cdot \begin{bmatrix} - & + & - & + \\ + & - & - & + \\ - & - & - & - \\ + & + & - & - \end{bmatrix} = 4 \cdot \begin{bmatrix} 1 & & & 0 \\ & 1 & & \\ & & 1 & \\ 0 & & & 1 \end{bmatrix}$$

This matrix offers the interest of making it possible to arrange its coefficients in columns, each column having a specific sign so long as an empty space is left between certain coefficients; the arrangement obtained is the following, the empty space being represented by a dot:

$$\begin{array}{ccccccccc}
+ & - & + & \cdot & - & & & & \\
 & & + & - & - & \cdot & + & & \\
 & & & - & - & - & \cdot & - & \\
 & & & & \cdot & \cdot & + & \cdot & +
\end{array}$$

Thus, nine columns of respective signs are obtained: +, −, +, −, −, −, +, −, +.

This particular feature makes it possible to construct a charge transfer device having nine electrodes and having the same sequence of signs. This device is shown in part (a) in FIG. 7 in which the place occupied by the four samples $X_1$, $X_2$, $X_3$, $X_4$ at four successive moments in time is likewise shown; the part (b) is a chronogram illustrating the functioning of the converter in part (a).

At the moment $t_1$, the samples $X_1$, $X_2$, $X_3$ and $X_4$ are respectively under electrodes 5, 3, 2 and 1 of signs − + − + and, at the output of the reading circuit, the first component $Y_1$ of the conversion corresponding to matrix $H_{orth.}$ is obtained; at the moment $t_2$, the four samples are respectively under electrodes 7, 5, 4, 3 of signs + − − + and at the output the second component $Y_2$ of the conversion is obtained; at the moment $t_3$ the samples are passed under electrodes 8, 6, 5, 4 and the third component $Y_3$ is obtained and finally, at $t_4$, the fourth component is obtained.

It will be noted that the minimum period of transfer (line T of the chronogram in part (b)) is equal to half the sampling period.

It will be noted furthermore that the starting matrix was equal to its opposite so that the device shown can be used equally well for direct and for opposite conversion, and this with one and the same timer.

Still dealing with the case of 4-point converters, the invention proposes furthermore devices based on matrices which are symmetrical in relation to the second diagonal. Such matrices are no longer orthogonal like the previous matrix and consideration must then be given to pairs of matrices and pairs of devices. By way of example, the following pairings could be quoted:

Pairing $H_1$, $H_1^{-1}$:

$$H_1 = \begin{bmatrix} + & - & - & + \\ + & + & - & - \\ + & - & + & - \\ + & + & + & + \end{bmatrix} \quad H_2^{-1} = \begin{bmatrix} + & + & + & + \\ - & + & - & + \\ - & - & + & + \\ + & - & - & + \end{bmatrix} \tag{9}$$

Pairing $H_2$, $H_2^{-1}$:

$$H_2 = \begin{bmatrix} + & - & - & + \\ + & - & + & - \\ + & + & - & - \\ + & + & + & + \end{bmatrix} \quad H_2^{-1} = \begin{bmatrix} + & + & + & + \\ - & - & + & + \\ - & + & - & + \\ + & - & - & + \end{bmatrix} \tag{10}$$

Pairing $H_3$, $H_3^{-1}$:

$$H_3 = \begin{bmatrix} + & - & + & - \\ + & - & - & + \\ + & + & - & - \\ + & + & + & + \end{bmatrix} \quad H_3^{-1} = \begin{bmatrix} + & + & + & + \\ - & - & + & + \\ + & - & - & + \\ - & + & - & + \end{bmatrix} \tag{11}$$

It will be readily seen that all these matrices are symmetrical in relation to the second diagonal, as stated above.

Figure 9:
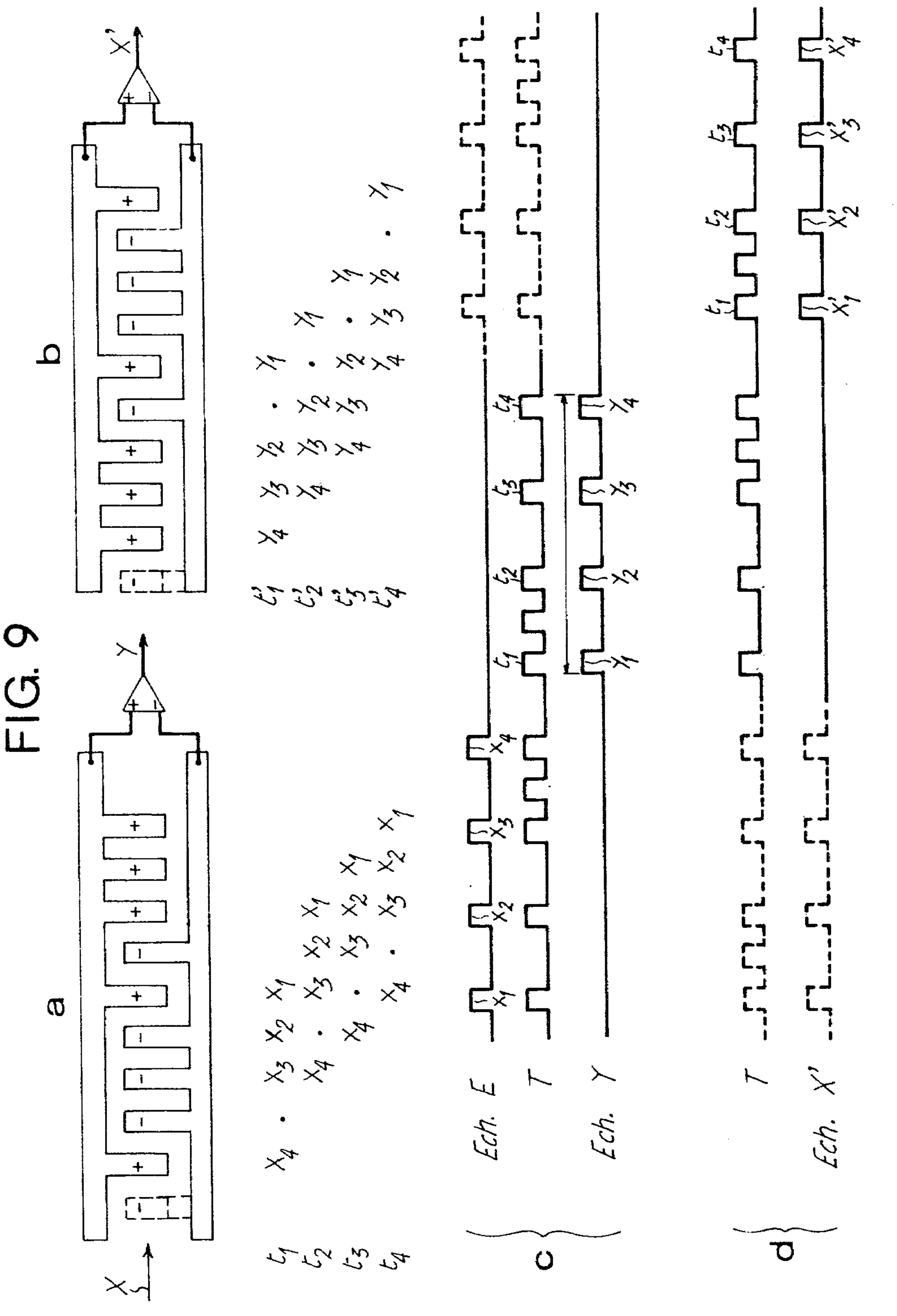

The charge transfer devices corresponding to the first two of these matrices are illustrated in FIGS. 8 and 9. Parts (a) then show devices for direct conversion, parts (b) the devices for reverse conversion, the chronograms in parts (c) illustrate the operation of the direct converters and the chronograms in parts (d) that of the reverse converters.

Only the devices in FIG. 8 will be described, those in FIG. 9 being similar.

The two devices in FIG. 8 each comprise nine electrodes in series, of respective signs +, −, −, −, +, +, −, +, +, in the case of that shown in part (a), and +, +, −, +, +, −, −, −, + for that shown in part (b). A single input circuit not shown is provided in each of these devices.

Operation of the device in part (a) is as follows.

At the moment $t_1$, samples $X_1$, $X_2$, $X_3$ and $X_4$ are respectively under electrodes 5, 4, 2 and 1 of sign + − − + and the first component $Y_1$ of the conversion corresponding to matrix $H_1$ is obtained at the output of the reading circuit; at the moment $t_2$ the four samples are respectively under electrodes 6, 5, 3, 2 of signs + + − − and at the output the second component $Y_2$ of the conversion is obtained; at the moment $t_3$ the samples are under electrodes 8, 7, 5, 4 and the third component $Y_3$ is obtained and finally the fourth component $Y_4$ is obtained at $t_4$.

The chronogram in part (c) illustrates these operations.

The opposite conversion corresponding to $H_1^{-1}$ is obtained by the device in part (b) which functions in the same way, as witnessed by the chronogram in part (d).

Figure 7:
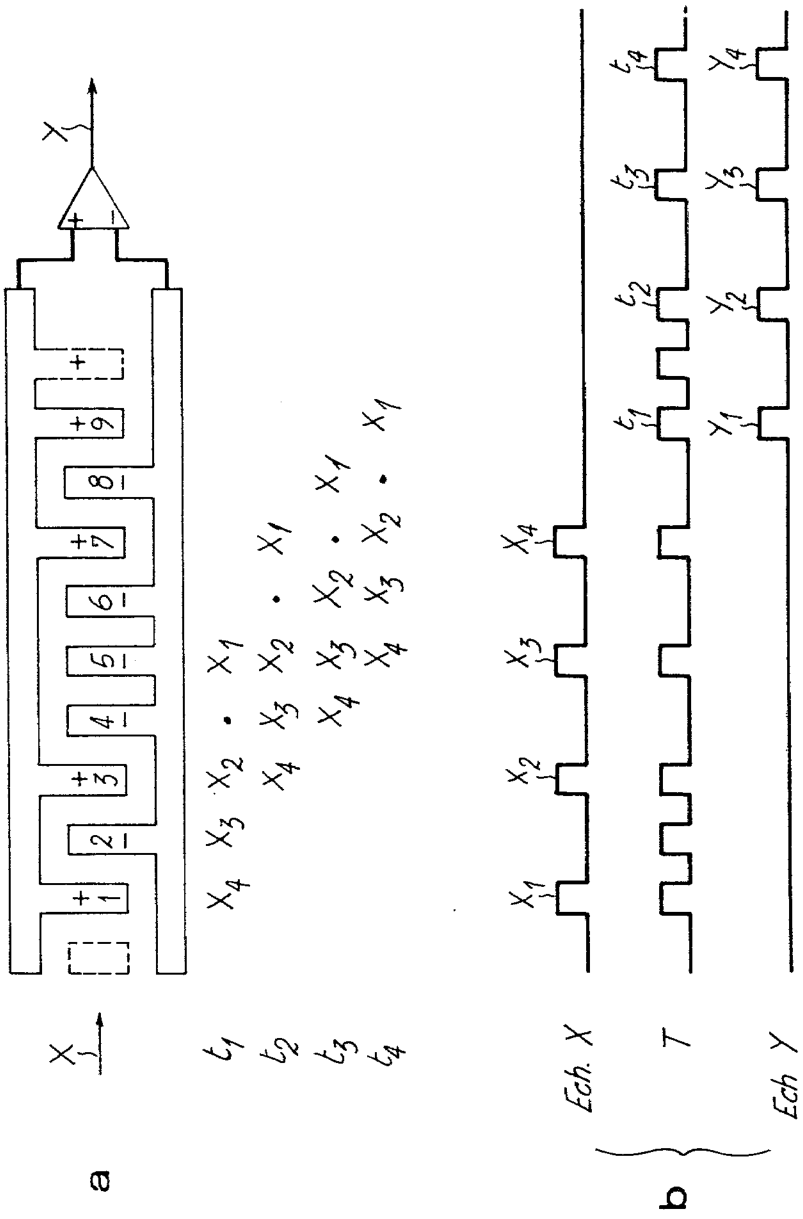

The leading electrode, represented by dotted lines in FIGS. 7, 8 and 9 may advantageously be negatively polarised (or positively according to circumstances) like an auxiliary electrode, in which case this electrode plays a double role: that of balancing the number of electrodes of each sign and that of allowing one and the same timer to operate two devices which are associated in parallel.

This latter property is true for the cases in FIGS. 7 and 8 but is not true for the majority of other solutions.

It will be noted that the devices which provide for direct conversion and opposite conversion are symmetrical with each other, the output of one possibly serving as the input of the other and vice versa.

It will also be noted and as in the previous example that the minimum transfer period (line T in the chronograms in parts (c) and (d)) is equal to half the sampling period.

These symmetrical devices are advantageous in so far as on the one hand one and the same timer can control them and on the other in so far as the lines of matrices corresponding to the two conversions correspond, but for the sign, to the Walsh functions which makes it possible to carry out data compression. Such pairs of devices can thus work on a bi-directional emission reception basis, each of the devices being indiscriminately used for emission or reception, on direct or reversed conversion.

Generally speaking, to find all the matrices which make it possible to construct a converter having n electrodes in lines, the following procedure may be adopted:

(1) first of all, a number n of electrodes is established. If N is the rank of the matrix, the number n is defined by $2N-1<n<N^2$; in the case of 4-point converters, the number of electrodes n is therefore between 7 and 16;

(2) then all possible permutations of the order of lines of the Hadamard matrix of rank N are carried out; for example, on a basis of the fourth rank Hadamard matrix given in (3), of which the lines are numbered 1, 2, 3 and 4, the following matrices are formed: (1,2,3,4), (1,2,4,3), (1,3,2,4), (1,3,4,2), etc. The number of matrices obtained is equal to N! in other words in this case 24;

(3) for each of the matrices obtained in the preceding phase, every possible combination of line sign is tried, that is to say to each line is allocated a multiplier coefficient equal to +1 (the coefficients of the matrix are then unchanged) or equal to −1 (the coefficients change their sign). For example, the matrix (1,3,2,4) gives rise to matrices (1,3,2,4), (1−3,2,4), (1,3,−2,4), (1,3,2,−4), (1,−3,−2,4), etc. . . . ;

(4) for each matrix obtained in phase 3, all the ways of arranging the coefficients of each line are tried, using if need be empty spaces on condition that the same relative place is retained for the empty space or spaces. These dispositions correspond to the successive dispositions of samples in the device. For example, in the case of the matrix (1,−3,−2,4) and considering that in the real device the coefficients are ranged from right to left if the input of the device is on the left, the following dispositions may be envisaged (the dot corresponding to an empty space): ++++, +.+++, ++.++, +++.+, +.++.+, +..+++, ++..++, +++..+, etc., for the first line; retaining the same relative disposition of the coefficients for the following lines, possible offsets of these lines in relation to one another are tried, which physically corresponds to propagation of the blocks of samples. Thus, from a first line +++.+, dispositions such as the following are obtained:

```
+++ . +            +++ . +            +++ . +
 ++− . −            ++− . −            ++− . −
  +−+ . −           . +−+ . −           +−+ . −
   +−− . +            +−− . +            . +−−+
```

Obviously, the first two panels are unsuitable since some columns contain both plus signs and minus signs. On the other hand, the last panel leads to an acceptable solution (this is moreover the disposition corresponding to FIG. 12*b*) and to the matrix $H_2^{-1}$ given above at (10);

(5) when such a matrix is obtained, the opposite matrix is sought. In the previous example, this is the matrix $H_2$ already given;

(6) in the same way as in (4), from the opposite matrix found in (5), a disposition of coefficients is sought which lends itself to the provision of a line structure.

The following solution is found in the example given:

```
+ . −−+
   − . +−+
      − . −++
         + . +++
```

which corresponds to the device in FIG. 9*a*.

All these operations may be carried out by a suitably programmed computer.

The search procedure which has just been indicated makes it possible in additional to the orthogonal matrix (8) and symmetrical matrices (9), (10), (11) to find other symmetrical matrices and also asymmetrical matrices. In contrast to the former, these latter are suitable only for uni-directional linkage, because one of the two matrices is composed of lines which do not correspond to Walsh functions and which do not provide components of which the statistical properties permit of date compression. These are for example the following matrices:

$$^{o}H = \begin{bmatrix} +&+&+&+ \\ -&-&+&+ \\ +&-&-&+ \\ +&-&+&- \end{bmatrix} \qquad ^{o}H^{-1} = \begin{bmatrix} +&-&+&+ \\ +&-&-&- \\ +&+&-&+ \\ +&+&+&- \end{bmatrix} \tag{12}$$

which correspond to devices of which the electrodes have respectively the signs ++++−−+−+ and +−+−−++++. If the first matrix has lines which correspond to a Walsh function, this is not on the other hand the case with the second.

Among the asymmetrical solutions, there is one which provides devices each having eight electrodes. The corresponding matrices are the following:

$$\begin{bmatrix} -&+&-&+ \\ -&-&+&+ \\ -&-&-&- \\ +&-&-&+ \end{bmatrix} \qquad \begin{bmatrix} -&-&-&+ \\ +&-&-&- \\ -&+&-&- \\ +&+&-&+ \end{bmatrix} \tag{13}$$

and the sequences of signs of electrodes are respectively ++−+−−−+ and +−−−+−++.

It will be noted that the number of positive electrodes is equal to the number of negative electrodes, which avoids the use of balancing electrodes. The total number of electrodes is therefore minimal and equal to 8.

The search for 8th rank matrices may be carried out in the same way as indicated above in respect of 4th rank matrices. The procedure is the same but the number of cases to be envisaged becomes quite considerable since then N!=8!, in other words 40320.

It is also possible to construct a matrix $H_8$ of 8th rank from a 4th rank $H_4$ matrix found as indicated above, by forming the matrix:

$$H_8 = \begin{bmatrix} H_4 & H_4 \\ H_4 & \sim H_4 \end{bmatrix} \tag{14}$$

It is also possible to construct matrices which are symmetrical in relation to the second diagonal, starting with a 4-point symmetrical matrix $^{s}H_4$ (such as $H_1$, $H_1^{-1}$, $H_2$, $H_2^{-1}$, $H_3$, $H_3^{-1}$) given by equations (9), (10) and (11) and by constructing the 8th rank symmetrical matrix $^{s}H_8$:

$$^{s}H_8 = \begin{bmatrix} ^{s}H_4 & ^{s}H_4 \\ ^{s}H_4 & ^{s}H_4 \end{bmatrix} \tag{15}$$

Figure 10:
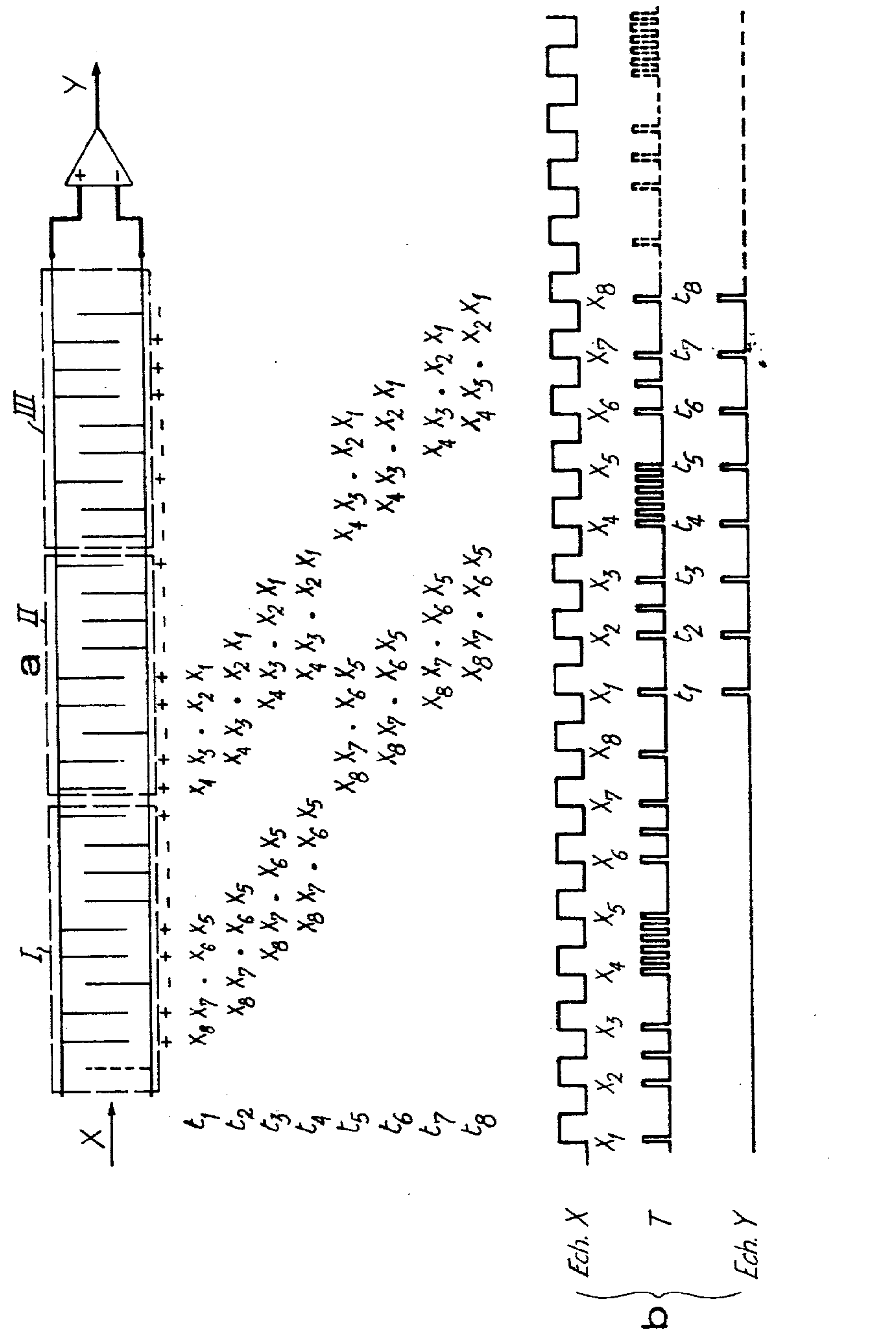

It is thus possible to construct types of 8-point converters each having 27 electrodes instead of 64, from the converters in FIGS. 8 and 9. One of these converters is shown in FIG. 10. It is derived directly from the 4-point converter in FIG. 8*b* and corresponds to the following 8 row matrix:

$$\begin{bmatrix} ++++++++ \\ -+-+-+-+ \\ --++--+- \\ +--++--+ \\ ----++++ \\ +-+--+-+ \\ ++----++ \\ -++-+--+ \end{bmatrix} \quad (16)$$

This matrix can be broken down into four blocks of size 4 and may be written:

$$\begin{bmatrix} H_1^{-1} & H_1^{-1} \\ -H_1^{-1} & H_1^{-1} \end{bmatrix} \quad (17)$$

in which $H_1^{-1}$ is the size 4 matrix already defined (equation (9)). As the structure of the matrix (17) is identical to that of the matrix $H_0$ given by the equation (7), which is translated by a 3-electrode converter (FIG. 6), the disposition corresponding to the matrid (17) will in turn comprise three groups of electrodes thus reflecting the structure (17), each group comprising nine electrodes disposed in the same way as for the device in FIG. 10. The first two groups constitute converters based on the matrix $H_1^{-1}$ and the third constitutes a converter based on the matrix $-H_1^{-1}$. This last group is therefore obtained by reversing all the signs of the electrodes constituting the first group. This is what is shown in part (a) of FIG. 10 in which the three groups of electrodes I, II and III are framed.

The chronogram in part (b) of FIG. 10 illustrates the operation of the device with the notations already used. It will be noted that the rhythm of transfer is five times greater than the rhythm of sampling.

There is furthermore a solution which leads to a row composed of only 25 electrodes (plus one balancing electrodes) and to a transfer frequency equal to only three times the sampling frequency. The sequence of electrode signs is as follows:

+ − + + + − − + − + + + + − − + − − − − − + + − + − the last electrode being the balancing electrode.

The search procedure given earlier makes it possible to find other solutions offering 25 electrodes and a transfer frequency equal to three times the sampling frequency.

In the same way, on the basis of an 8-point converter, it is possible to construct a 16-point converter by juxtaposition of 8-point converters. If the number of electrodes necessary is relatively small (81 instead of 256), the transfer timer rhythm becomes very high (13 times the sampling rhythm). This solution therefore quickly appears to be not very interesting except in particular cases.

As in the case of an 8-point converter, more advantageous solutions may be found directly with a computer carrying out a systematic search. However, the solutions found are likely to be heavy (too high a transfer rhythm).

This is the reason why preference may be given to proceeding in several stages once the number of points becomes high, as is illustrated in FIG. 11.

In part (a) of this drawing, the assembly shown comprises two stages:

the first consisting of two 4-point converters 131 and 131' disposed in parallel and identical to that shown in FIG. 8*b;* these converters in turn process four samples addressed by a multiplexer circuit 130;

the second constituted by a pair of transformers of 4 to 8 points, 133 and 133', the structure of which is directly derived from that of the converters in FIG. 6, that is to say having reading electrodes which respectively have as their sign +, + and −, with furthermore auxiliary electrodes interposed between the reading electrodes; a directional switching system 132 makes it possible appropriately to direct the groups of four samples delivered by the two converters 131 and 131' to one and then alternately to the other of the converters 133 and 133'.

An output multiplexer 134 then delivers groups of eight converted samples $Y_{(8)}$.

The number of electrodes used, having regard to balancing electrodes in broken lines (shown and counted in parantheses) is 2{[9+(2)]+[9+(8)]}, in other words 56. The timing frequency is determined by the first stage of the device: it is equal to twice the sampling frequency.

In part (b) of this same FIG. 11 there is shown an assembly comprising three stages constituted:

the first by a pair of 2 point converters, 141, 141', identical to that in FIG. 9(*a*) and supplied by a multiplexer 140;

the second by a pair of 2–4 point converters 143, 143' directly derived from the device in FIG. 9(*a*) but with the addition of an auxiliary electrode between the reading electrodes, this second stage being connected to the first by a switching system 142;

the third by a pair of 4–8 point converters 145, 145' identical to the circuits 133 and 133' in part (a), this third stage being connected to the second by a switching system 144, the output of the whole being via a demultiplexer 146.

In the second case, the number of electrodes used is: 2{[3+(2)]+[5+(4)]+[9+(8)]}, in other words 62, which is a few more than in the first case, but the transfer timing frequency becomes equal to the sampling frequency, which may have a certain advantage.

Among the solutions proposed hereinabove, the symmetrical solutions lead to two different devices for direct and opposite conversion. However, as indicated above, they may be used for a bi-directional link. The asymmetrical solutions on the other hand permit only of a uni-directional link. However, it is possible to obtain a device valid at once for direct conversion and for opposite conversion by having this type of converter followed by an inverter which acts on certain of the samples delivered by the converter by changing their sign. This inverter may be constituted for example by a gain amplifier −1. The output samples either pass through this amplifier when their sign has to be reversed or avoid this amplifier when their sign has to be maintained. The switching moments are obtained from the sampling timer. Another solution, for changing the sign, is at the appropriate moment to permutate the inputs of the differential amplifier of the reading circuit. To expound on this point, it is possible to refer to the example of the 4-point converter already described hereinabove and which has a minimum number of electrodes. The associated matrix is written:

$$\begin{bmatrix} - & + & - & + \\ - & - & + & + \\ - & - & - & - \\ + & - & - & + \end{bmatrix}$$

It will be seen that it is sufficient to reverse the sign of the coefficients of the second line in order to obtain a matrix which is symmetrical in relation to the first diagonal:

$$\begin{bmatrix} - & + & - & + \\ + & + & - & - \\ - & - & - & - \\ + & - & - & + \end{bmatrix}$$

This matrix is then equal to its opposite and characterises both direct and opposite conversion. The converter, thus fitted with its reverse amplifier, then becomes suitable for a bi-directional link.

In devices such as those in FIG. 11, a single differential amplifier may be used to constitute a single reading circuit for each double branch on condition that this amplifier be switched sometimes at the output of one branch, sometimes at the output of the other, since each of them only works for half the time.

It also goes without saying that on a basis of each solution given hereinabove it is possible to obtain yet another solution by changing all the signs of the electrodes, which results in samples of opposite signs which it is then sufficient to reverse once again.

The Hadamard converters according to the invention offer a considerable advantage which is not to be found with other similar converters. It is the advantage of compatability with DTC image analysers. We know that these devices, veritable electronic "retinas", consist of a matrix of photosensitive cells constituted like the charge transfer devices with at the output an offset register and a charge detector circuit.

FIG. 12 diagrammatically recalls the structore of such a device in an embodiment which employs a first zone consisting of columns 150 forming a photosensitive zone and a second zone formed by columns 152 disposed in the extension of the first but which are not photosensitive; an offset register 154 is disposed in the bottom part of the columns 152. These three assemblies 150, 152 and 154 are constituted by DTC's. The device is completed by a charge detection circuit 156 which delivers an electrical voltage in proportion to the charges received.

Such a device operates in the following manner: the image to be converted is projected onto the zone formed by the columns 150; minority carriers form under this photonic excitation and become accumulated under each of the electrodes in proportion to the strength of illumination received. This "electronic image" is then rapidly transferred into the buffer zone formed by the columns 152 and the first zone regains its photodetection function. The charges stored in the buffer zone are then transferred downwardly, line by line, in the register 154, which is then emptied from left to right towards the output device 156 which delivers samples X, each of which represents a point of the image analysed. When the entire raster has thus been expelled from the buffer zone, a fresh raster is registered therein and the process recommences.

A more detailed description of these devices and of numerous other alternative constructions will be found in the work mentioned previously, pages 142 to 200.

Integration of the Hadamard converter in the image analysing device is facilitated from the technological point of view since both cases relate to charge transfer devices which require the same elements and the same materials. The whole constitutes a monolith device which directly provides for Hadamard conversion of the images or sub-images analysed, these latter possibly being portions of one and the same line or rectangular sub-images according to the other in which points of the image are transferred to the output register of the analyser.

In order to illustrate this integration, consideration will by way of example be given to the conversion shown in FIG. 8 which deals with groups of four samples.

Figure 13:
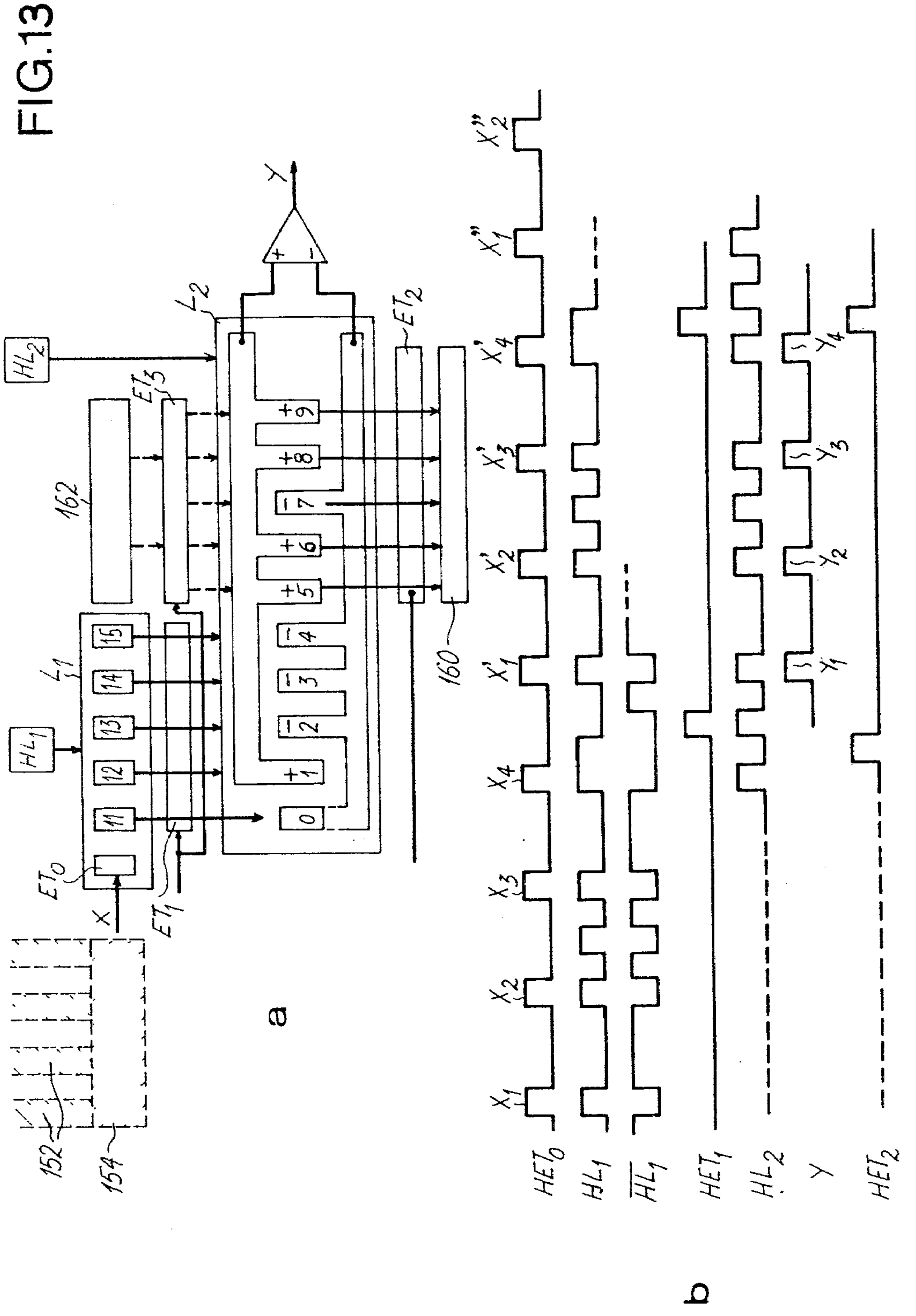

Part (a) of FIG. 13 shows a complete converter. In addition to the line converter $L_2$ in accordance with that in FIG. 8 and comprising electrodes 1 to 9 (and 0 for the auxiliary input electrodes), there is an input line $L_1$ comprising electrodes 11, 12, 13, 14 and 15 preceded by an input electrode $ET_o$, a first transfer electrode $RT_1$, a charge dissipator 160. The input line $L_1$ is controlled by a timer $HL_1$, the line $L_2$ of the converter being controlled by another timer $HL_2$.

The device furthermore comprises a charge injector diode 162 and a third transfer electrode $ET_3$ controlled in the same way as the electrode $ET_1$.

The diagram shown in part (b) of FIG. 13 shows the signals applied to the elements of the device: viz., to the line $HET_o$ or sampling line, the pulses for injection of samples into the input electrode $ET_o$, the timing pulses $\overline{HL_1}$, the pulses applied to the intermediate electrodes (in the case of a 2-phase device) $HL_1$, the pulses $HET_1$ applied to the transfer electrode $ET_1$, the pulses $HL_2$ from the second timer, the moments of conversion of output samples and finally the pulses $HET_2$ applied to the second transfer electrode.

The samples are introduced in series under electrodes 11 to 15 of line $L_1$ via the electrode $ET_o$ (pulse $HET_o$); when $HL_1$ is active (high level) and $HT_o$ also, the charges X are transferred to the line $L_1$. When $HL_1$ is active and $ET_o$ is blocked (low level), the charges X are not transmitted and a zero charge is injected which makes it possible to carry out conversion with coefficients which are not grouped (case corresponding to FIGS. 8, 9 and 10). In the case of a grouped coefficient conversion (as will be seen hereinafter), the electrode $ET_o$ is no longer necessary.

When $X_1$, $X_2$, $X_3$ and $X_4$ are respectively at 15, 14, 12 and 11, this group of four samples is transferred via $ET_1$ respectively to beneath electrodes 4, 3, 1 and 0. During this lateral transfer, the longitudinal transfer is blocked $\overline{HL_1}$ remains at the low level (in the case of four electrode, 2-phase technology). Two cases arise:

(a) the samples X are polarised, in this case it is necessary to introduce charges corresponding to the level of polarisation under electrodes 5 to 9 as for example under the electrode 2 in the example corresponding to FIG. 8, that is to say under all the electrodes where there is no charge. This is obtained by means of the electrode $ET_3$, likewise controlled by $HET_1$, which allows the charges created by a charge generator (polarised injecting diode 162) to pass;

(b) if the samples X are not polarised, $ET_3$ and the corresponding charge generator 162 are not used.

The timer $HL_2$ then establishes the rhythm of the output of samples $Y_1$, $Y_2$, $Y_3$ and $Y_4$. When the last sample is obtained, action is taken on the transfer electrode $ET_2$ so that the charges disposed under electrodes 5, 6, 8 and 9 are absorbed by the device 160 (for this same purpose, it would also be possible to apply the voltage of the substrate to the electrodes). The moment after (see $HL_2$), the transfer electrode $ET_1$ is operated so that the charges corresponding to the following subimage ($X'_1$, $X'_2$, $X'_3$, $X'_4$) are transferred to below electrodes 0 to 4. The process is thus continued by groups of four samples.

Implanting in identical fashion a converter operating on a larger number of samples (8 or 16) or of intermediate converters (4→8 or 8→16), see FIG. 11, is immediate and is derived from that of the 4-point device mentioned hereinabove.

Integration of the device described into an image analyser as shown in FIG. 13*a* is simple:

the line $L_1$ of electrodes 11 to 15 may form part of the output register 154. This is particularly advantageous for converters which process grouped samples, that is to say samples which have no empty gap between them, since the analyser delivers such groups. The electrode $ET_o$ then becomes useless. The search process indicated above makes it possible to find such solutions for grouped coefficients. By way of explanation, the following solutions may be considered:

(a) for a 4-point converter:

sequence of signs of electrodes

+ + + + − − + − + positioning of samples

```
++++
 .++--
   .+--+
      .-+-+
```

This converter comprises nine electrodes and requires a transfer frequency equal to twice the sampling frequency.

(b) for an 8-point converter:

sequence of signs of electrodes

+ + + + + + + + − − − − + + − − + + − + − − + − + − + location of samples

```
++++++++
 . . .++++----
          ++----++
            . . .--++--++
                   -++--++-
                    . . .-++-+--+
                           +-+--+-+
                            . . .-+-+-+
```

This converter comprises 29 electrodes and requires a transfer frequency equal to four times the sampling frequency.

The two solutions indicated constitute asymmetrical solutions and cannot be used except for uni-directional transmission, unless the sign of certain samples is reversed, as indicated above, in order to regain orthogonal conversion.

It goes without saying that the invention is not limited to the use of "coupled charge devices" (CCD's), but in contrast extends to all types of charge transfer devices including the so-called "Bucket Brigade Devices", or, in abbreviated form, BBD's, all these types of device being described in the previously mentioned work.

I claim:

1. A device for carrying out a Hadamard conversion on periodic sampled signals, such conversion giving from a sequence of N input samples another sequence of N output samples connected to the input samples by a linear relationship which can be represented by a square matrix of dimension N having lines and columns of coefficients equal to +1 or −1, comprising:

a charge transfer device comprising a plurality of electrodes disposed in lines, some electrodes being referred to as + sign electrodes and others as − sign electrodes;

an input circuit capable of forming from an input signal with a determined sampling period sequences of N input samples, for converting each sample into bundles of charges and for injecting these bundles at appropriate moments under appropriate electrodes on the charge transfer device;

a circuit for controlling the transfer of charges from one electrode to the next and doing so at a first transfer frequency corresponding to a transfer period;

a differential charge reader comprising two charge measuring circuits and a two-input differential amplifier, one non-reversing connected to said + sign electrodes and the other reversing connected to said − sign electrodes, each connected to one of the said measuring circuits, and an output;

a circuit for forming output samples at a second frequency from the signal furnished by the differential charge reader, wherein:

the charge transfer device comprises $N^2$ reading electrodes disposed in series on one and the same line and divided into N groups each of N electrodes, the sequence of signs of the electrodes of one group being identical to the reversed sequence of signs of a line of the matrix representing conversion;

the input circuit injects bundles of charges under the first electrode of the first group; and the minimum transfer period is equal to 1/N times the sampling period.

2. A device for carrying out a Hadamard conversion on periodic sampled signals, such conversion giving from a sequence of N input samples another sequence of N output samples connected to the input samples by a linear relationship which can be represented by a square matrix of dimension N having lines and columns of coefficients equal to +1 or −1, comprising:

a charge transfer device comprising a plurality of electrodes disposed in lines, some electrodes being referred to as + sign electrodes and others as − sign electrodes;

an input circuit capable of forming from an input signal with a determined sampling period sequences of N input samples, for converting each sample into bundles of charges and for injecting these bundles at appropriate moments under appropriate electrodes on the charge transfer device;

a circuit for controlling the transfer of charges from one electrode to the next and doing so at a first transfer frequency corresponding to a transfer period;

a differential charge reader comprising two charge measuring circuits and a two-input differential amplifier, one non-reversing connected to said + sign electrodes and the other reversing connected to said − sign electrodes, each connected to one of the said measuring circuits, and an output;

a circuit for forming output samples at a second frequency from the signal furnished by the differential charge reader, wherein:

the charge transfer device comprises:

(a) N groups of N reading electrodes, said $N^2$ electrodes being disposed in series on one line, the sequence of signs of electrodes belonging to one and the same group being identical to the sequence of signs of coefficients of a column of the matrix representing the conversion;

(b) N columns of electrodes in parallel, the $i^{th}$ column comprising i electrodes and being disposed opposite the first electrode of the $i^{th}$ group of electrodes of (a) above;

the input circuit comprises N input elements in the N columns of electrodes of (b) above, said N elements simultaneously receiving the input signal and being operated in turn, commencing by the $N^{ith}$ and ending at the first;

the transfer frequency is equal to the sampling frequency.

3. A device according to claim 1 or 2 for a conversion relating to sequences of N=2P samples, comprising a device operating on P samples, followed by a linear P-2P point converter comprising:

(a) two columns of electrodes respectively comprising 2P and P electrodes, each of said columns being provided with an input circuit receiving the P converted samples delivered by the preceding device;

(b) two columns of P+1 electrodes, each of said columns being in the alignment of the columns of (a), one in P of said electrodes being connected to one or the other of the two inputs of a differential amplifier.

4. A device for carrying out a Hadamard conversion on periodic sampled signals, such conversion giving from a sequence of N input samples another sequence of N output samples connected to the input samples by a linear relationship which can be represented by a square matrix of dimension N having lines and columns of coefficients equal to +1 or −1, comprising:

a charge transfer device comprising a plurality of electrodes disposed in lines, some electrodes being referred to as + sign electrodes and others as − sign electrodes;

an input circuit capable of forming from an input signal with a determined sampling period sequences of N input samples, for converting each sample into bundles of charges and for injecting these bundles at appropriate moments under appropriate electrodes on the charge transfer device;

a circuit for controlling the transfer of charges from one electrode to the next and doing so at a first transfer frequency corresponding to a transfer period;

a differential charge reader comprising two charge measuring circuits and a two-input differential amplifier, one non-reversing connected to said + sign electrodes and the other reversing connected to said − sign electrodes, each connected to one of the said measuring circuits, and an output;

a circuit for forming output samples at a second frequency from the signal furnished by the differential charge reader, wherein: the charge transfer device comprises three electrodes in line of respective signs +, +, − or −, +, +, the charge transfer frequency being equal to the sampling frequency of the output signal.

5. A device for carrying out a Hadamard conversion on periodic sampled signals, such conversion giving from a sequence of N input samples another sequence of N output samples connected to the input samples by a linear relationship which can be represented by a square matrix of dimension N having lines and columns of coefficients equal to +1 or −1, comprising:

a charge transfer device comprising a plurality of electrodes disposed in lines, some electrodes being referred to as + sign electrodes and others as − sign electrodes;

an input circuit capable of forming from an input signal with a determined sampling period sequences of N input samples, for converting each sample into bundles of charges and for injecting these bundles at apporpriate moments under appropriate electrodes on the charge transfer device;

a circuit for controlling the transfer of charges from one electrode to the next and doing so at a first transfer frequency corresponding to a transfer period;

a differential charge reader comprising two charge measuring circuits and a two-input differential amplifier, one non-reversing connected to said + sign electrodes and the other reversing connected to said − sign electrodes, each connected to one of the said measuring circuits, and an output;

a circuit for forming output samples at a second frequency from the signal furnished by the differential charge reader, wherein: the charge transfer device comprises nine electrodes in line and of respective predetermined signs, the minimum duration of the transfer period being equal to half the sampling period of the output signal.

6. A device according to claim 5, wherein the signs of the nine electrodes in line are:
+−−−++−++.

7. A device according to claim 5, wherein the signs of the nine electrodes in line are:
++−++−−−+.

8. A device according to claim 5, wherein the signs of the nine electrodes in line are:
+−−−+−+++.

9. A device according to claim 5, wherein the signs of the nine electrodes in line are:
+++−+−−−+.

10. A device according to claim 5, wherein the signs of the nine electrodes in line are:
−+−−++−+.

11. A device according to claim 5, wherein the signs of the nine electrodes in line are:
+−+++−−+−.

12. A device according to claim 5, wherein the signs of the nine electrodes in line are:
++++−−+−+.

13. A device according to claim 5, wherein the signs of the nine electrodes in line are:
+−+−−++++.

14. A device according to claim 5, wherein the signs of the nine electrodes in line are:
++−+−−−+.

15. A device according to claim 5, wherein the signs of the nine electrodes in line are:
+−−−+−++.

16. A device according to any one of claims 4, 5 and 6 to 15 wherein the charge transfer device is completed by balancing electrodes which render the number of + sign electrodes equal to the number of − sign electrodes.

17. A device according to any one of claims 4, 5 and 6 to 15 wherein the converter is provided at its output with an inverter receiving certain of the output samples, the converter-inverter assembly then constituting a bi-directional converter.

* * * * *